(12) United States Patent
Timme et al.

(10) Patent No.: US 11,018,652 B2
(45) Date of Patent: *May 25, 2021

(54) TUNABLE RESONATOR ELEMENT, FILTER CIRCUIT AND METHOD

(71) Applicant: Infineon Technologies AG, Neubiberg (DE)

(72) Inventors: Hans-Joerg Timme, Ottobrunn (DE); Ruediger Bauder, Feldkirchen-Westerham (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 13 days.

This patent is subject to a terminal disclaimer.

(21) Appl. No.: 16/210,756

(22) Filed: Dec. 5, 2018

(65) Prior Publication Data

US 2019/0181827 A1 Jun. 13, 2019

Related U.S. Application Data

(60) Provisional application No. 62/595,898, filed on Dec. 7, 2017, provisional application No. 62/641,664, filed on Mar. 12, 2018.

(30) Foreign Application Priority Data

Dec. 5, 2018 (EP) .................................... 18210369

(51) Int. Cl.
*H03H 9/58* (2006.01)
*H03H 9/54* (2006.01)
(Continued)

(52) U.S. Cl.
CPC .............. *H03H 9/584* (2013.01); *H03F 3/19* (2013.01); *H03F 3/21* (2013.01); *H03H 3/02* (2013.01);
(Continued)

(58) Field of Classification Search
CPC ........ H03H 9/547; H03H 9/0547; H03H 9/60; H03H 9/584; H03H 3/02; H03H 9/02007;
(Continued)

(56) References Cited

U.S. PATENT DOCUMENTS 2,271,870 A 2/1942 Mason
4,013,982 A 3/1977 Wood et al.
(Continued)

FOREIGN PATENT DOCUMENTS

EP 1381163 A1 1/2004
FR 2235532 A1 1/1975
(Continued)

OTHER PUBLICATIONS

Bauer, Thomas et al., "SAW Band Rejection Filters for Mobile Digital Television," IEEE International Ultrasonics Symposium Proceedings, Nov. 2-5, 2008, pp. 288-291. DOI: 10.1109/ULTSYM.2008.0071.

(Continued)

*Primary Examiner* — Rakesh B Patel
*Assistant Examiner* — Jorge L Salazar, Jr.
(74) *Attorney, Agent, or Firm* — Slater Matsil, LLP

(57) ABSTRACT

A resonator element for use in a filter is provided. The resonator element includes a first resonator acoustically coupled to a second or third resonator or both. The first resonator has terminals for incorporation in a filter structure. A tuning circuit is coupled to the second or third resonator or both to enable tuning of the resonator element. The tuning circuit includes a variable capacitor and an inductor.

28 Claims, 19 Drawing Sheets

(51) Int. Cl.
| | |
|---|---|
| *H03H 7/01* | (2006.01) |
| *H03H 9/64* | (2006.01) |
| *H03H 9/52* | (2006.01) |
| *H03H 9/05* | (2006.01) |
| *H03H 9/60* | (2006.01) |
| *H04B 1/00* | (2006.01) |
| *H03H 3/02* | (2006.01) |
| *H03H 11/12* | (2006.01) |
| *H04B 1/10* | (2006.01) |
| *H04B 1/40* | (2015.01) |
| *H03H 9/02* | (2006.01) |
| *H03H 9/17* | (2006.01) |
| *H03H 9/48* | (2006.01) |
| *H03H 9/00* | (2006.01) |
| *H03H 9/66* | (2006.01) |
| *H04B 1/04* | (2006.01) |
| *H04B 1/50* | (2006.01) |
| *H03H 7/12* | (2006.01) |
| *H03H 7/46* | (2006.01) |
| *H04B 1/525* | (2015.01) |
| *H03F 3/19* | (2006.01) |
| *H03F 3/21* | (2006.01) |
| *H03H 9/70* | (2006.01) |
| *H04B 1/18* | (2006.01) |
| *H03J 3/20* | (2006.01) |
| *H03H 9/205* | (2006.01) |
| *H01L 41/187* | (2006.01) |
| *H03J 1/00* | (2006.01) |

(52) U.S. Cl.
CPC ........ *H03H 7/0115* (2013.01); *H03H 7/0153* (2013.01); *H03H 7/0161* (2013.01); *H03H 7/12* (2013.01); *H03H 7/1741* (2013.01); *H03H 7/463* (2013.01); *H03H 9/0004* (2013.01); *H03H 9/02007* (2013.01); *H03H 9/02015* (2013.01); *H03H 9/02031* (2013.01); *H03H 9/0547* (2013.01); *H03H 9/175* (2013.01); *H03H 9/205* (2013.01); *H03H 9/48* (2013.01); *H03H 9/52* (2013.01); *H03H 9/54* (2013.01); *H03H 9/542* (2013.01); *H03H 9/547* (2013.01); *H03H 9/585* (2013.01); *H03H 9/60* (2013.01); *H03H 9/6479* (2013.01); *H03H 9/66* (2013.01); *H03H 9/70* (2013.01); *H03H 11/1291* (2013.01); *H03J 3/20* (2013.01); *H04B 1/006* (2013.01); *H04B 1/0057* (2013.01); *H04B 1/0475* (2013.01); *H04B 1/10* (2013.01); *H04B 1/1036* (2013.01); *H04B 1/18* (2013.01); *H04B 1/40* (2013.01); *H04B 1/50* (2013.01); *H04B 1/525* (2013.01); *H01L 41/187* (2013.01); *H03F 2200/222* (2013.01); *H03F 2200/294* (2013.01); *H03F 2200/451* (2013.01); *H03F 2203/21157* (2013.01); *H03H 9/587* (2013.01); *H03H 9/588* (2013.01); *H03H 9/589* (2013.01); *H03H 9/605* (2013.01); *H03H 2007/013* (2013.01); *H03H 2009/02204* (2013.01); *H03H 2210/025* (2013.01); *H03H 2210/026* (2013.01); *H03J 1/0008* (2013.01)

(58) Field of Classification Search
CPC .............. H03H 9/205; H03H 11/1291; H03H 9/02015; H03H 9/175; H03H 9/48; H03H 9/585; H03H 7/0161; H03H 9/0004; H03H 9/66; H03H 7/12; H03H 7/463; H03H 7/0115; H03H 9/542; H03H 9/70; H03H 7/1741; H03H 9/02031; H03H 7/0153; H03H 9/54; H03H 9/6479; H03H 9/52; H03H 2210/026; H03H 9/587; H03H 9/589; H03H 2009/02204; H03H 9/588; H03H 9/605; H03H 2203/21157; H03H 2007/013; H03H 2210/025; H04B 1/006; H04B 1/10; H04B 1/40; H04B 1/0057; H04B 1/0475; H04B 1/50; H04B 1/525; H04B 1/1036; H04B 1/18; H04B 1/005; H03F 3/19; H03F 3/21; H03F 2203/21157; H03F 2200/222; H03F 2200/294; H03F 2200/451; H03F 3/195; H03J 3/20; H03J 1/0008; H01L 41/187
USPC .......................... 333/186, 187, 188
See application file for complete search history.

(56) References Cited

U.S. PATENT DOCUMENTS

| | | | |
|---|---|---|---|
| 5,128,625 | A | 7/1992 | Yatsuzuka et al. |
| 5,729,829 | A | 3/1998 | Talwar et al. |
| 5,774,193 | A | 6/1998 | Vaughan |
| 5,864,261 | A | 1/1999 | Weber et al. |
| 6,072,996 | A | 6/2000 | Smith |
| 6,472,959 | B1 | 10/2002 | Beaudin et al. |
| 7,535,324 | B2 | 5/2009 | Fattinger et al. |
| 7,825,745 | B1 | 11/2010 | Gavin et al. |
| 7,986,198 | B2 * | 7/2011 | Nakatsuka ............. H03H 9/587 333/133 |
| 8,018,303 | B2 | 9/2011 | Handtmann et al. |
| 8,682,260 | B1 | 3/2014 | Granger-Jones et al. |
| 8,841,819 | B2 * | 9/2014 | Nishihara ............. H03H 9/584 310/320 |
| 9,461,618 | B2 | 10/2016 | Pang et al. |
| 9,787,334 | B2 | 10/2017 | Obiya et al. |
| 10,404,233 | B2 * | 9/2019 | Bauder .................. H03H 9/584 |
| 2001/0017504 | A1 | 8/2001 | Aigner et al. |
| 2002/0163404 | A1 | 11/2002 | Sonoda et al. |
| 2002/0164961 | A1 | 11/2002 | Atkinson et al. |
| 2002/0183016 | A1 | 12/2002 | Kemmochi et al. |
| 2003/0127946 | A1 | 7/2003 | Yamada et al. |
| 2004/0012570 | A1 | 1/2004 | Cross et al. |
| 2004/0051601 | A1 | 3/2004 | Frank |
| 2004/0127178 | A1 | 7/2004 | Kuffner |
| 2004/0204814 | A1 | 10/2004 | Honda |
| 2005/0012570 | A1 | 1/2005 | Korden et al. |
| 2005/0069065 | A1 | 3/2005 | Oh et al. |
| 2005/0099244 | A1 | 5/2005 | Nakamura et al. |
| 2005/0148312 | A1 | 7/2005 | Toncich et al. |
| 2005/0245213 | A1 | 11/2005 | Hirano et al. |
| 2006/0176126 | A1 | 8/2006 | Wang et al. |
| 2006/0229030 | A1 | 10/2006 | Simon et al. |
| 2007/0024395 | A1 | 2/2007 | Takako |
| 2007/0176710 | A1 | 8/2007 | Jamneala et al. |
| 2008/0028585 | A1 | 2/2008 | Barber et al. |
| 2008/0048802 | A1 | 2/2008 | Aigner et al. |
| 2008/0129428 | A1 | 6/2008 | Yamamoto |
| 2008/0152049 | A1 | 6/2008 | Sandner et al. |
| 2008/0169884 | A1 | 7/2008 | Matsumoto et al. |
| 2009/0128260 | A1 | 5/2009 | Block et al. |
| 2009/0265903 | A1 | 10/2009 | Handtmann et al. |
| 2009/0273416 | A1 | 11/2009 | Nakatsuka et al. |
| 2010/0118921 | A1 | 5/2010 | Abdelmonem et al. |
| 2011/0277286 | A1 | 11/2011 | Zhang |
| 2012/0007696 | A1 | 1/2012 | Pang et al. |
| 2012/0086522 | A1 | 4/2012 | Mao et al. |
| 2012/0235877 | A1 | 9/2012 | Beaudin et al. |
| 2012/0286900 | A1 | 11/2012 | Kadota et al. |
| 2013/0077540 | A1 | 3/2013 | Black et al. |
| 2013/0122831 | A1 | 5/2013 | Desclos et al. |
| 2013/0176912 | A1 | 7/2013 | Khlat |
| 2014/0003300 | A1 | 1/2014 | Weissman et al. |
| 2014/0038531 | A1 | 2/2014 | Hayafuji et al. |
| 2014/0145799 | A1 | 5/2014 | Jian et al. |
| 2014/0162712 | A1 | 6/2014 | Feld et al. |
| 2014/0313947 | A1 | 10/2014 | Ali-Ahmad |

(56) References Cited

U.S. PATENT DOCUMENTS

| | | | |
|---|---|---|---|
| 2015/0163747 | A1 | 6/2015 | Chen et al. |
| 2015/0171819 | A1 | 6/2015 | Asan et al. |
| 2015/0214985 | A1 | 7/2015 | Lee et al. |
| 2015/0236748 | A1 | 8/2015 | Nobbe |
| 2016/0112072 | A1 | 4/2016 | Bauder et al. |
| 2016/0204763 | A1 | 7/2016 | Tani |
| 2016/0365841 | A1 | 12/2016 | Dickerson |
| 2017/0026031 | A1 | 1/2017 | Levesque |
| 2017/0054485 | A1 | 2/2017 | Hwang et al. |
| 2017/0264268 | A1 | 9/2017 | Schmidhammer |
| 2017/0301992 | A1 | 10/2017 | Khlat et al. |
| 2017/0310302 | A1 | 10/2017 | Bauder et al. |
| 2018/0062674 | A1 | 3/2018 | Boghrat et al. |
| 2018/0205367 | A1 | 7/2018 | Sovero et al. |
| 2019/0372190 | A1 | 12/2019 | Kord et al. |

FOREIGN PATENT DOCUMENTS

| | | | |
|---|---|---|---|
| GB | 2431062 | A | 4/2007 |
| GB | 2457607 | B | 11/2009 |
| JP | S5252348 | A | 4/1977 |
| JP | H02199994 | A | 8/1990 |
| JP | 2009290365 | A | 12/2009 |
| WO | 9817000 | A1 | 4/1998 |
| WO | 0103314 | A1 | 1/2001 |
| WO | 2007149954 | A1 | 12/2007 |
| WO | 2015183548 | A1 | 12/2015 |
| WO | 2017204833 | A1 | 11/2017 |

OTHER PUBLICATIONS

Gopani, S., et al,. "SAW waveguide-coupled resonator notch filter," IEEE International Ultrasonic Symposium, Dec. 4-7, 1990, pp. 1-5. DOI: 10.1109/ULTSYM.1990.171317.

Handtmann, "Stacked Crystal Resonator: A Highly Linear BAW Device," IEEE International Ultrasonics Symposium, Sep. 20-23, 2009, pp. 889-892.

Hashimoto, Ken-ya et al., "Moving Tunable Filters Forward. A Heterointegration Research Project for Tunable Filters Combining MEMS and RF SAWVBAW Technologies," IEEE Microwave, vol. 16, Issue 7, Aug. 2015, pp. 89-97. DOI: 10.1109/MMM.2015. 2431237.

Huang, Yulin et al., "Design Consideration of SAW/BAW Band Reject Filters Embedded in Impedance Converter," IEEE Transactions on Ultrasonics, Ferroelectrics, and Frequency Control, vol. 64, Issue 9, Sep. 2017, pp. 1368-1374. DOI: 10.1109/TUFFC.2017. 2713395.

Huang, Yulin et al., "SAW/BAW band reject filters embedded in impedance converter," IEEE International Ultrasonics Symposium, Sep. 18-21, 2016, pp. 1-4. DOI: 10.1109/ULTSYM.2016.7728411.

Mourot, Loic et al., "Stopband filters built in the BAW technology," Application Notes, IEEE Microwave, vol. 9, Issue 5, Oct. 2008, pp. 104-116. DOI: 10.1109/MMM.2008.927635.

Obiya, H., et al., "A New Tunable RF Front-End Circuit for Advanced 4G Handsets," IEEE MTT-S Int. Microwave Symp. Digest, Session WEP-54, Jun. 2014, 3 pages.

Ogami, T., et al., "A New Tunable Filter Using Love Wave Resonators for Reconfigurable RF," 2014 IEEE MTT-S Int. Microwave Symp. Digest, session TU3A-2, Jun. 2014, 3 pages.

Psychogiou, Dimitra et al., "High-Q Bandstop Filters Exploiting Acoustic-Wave-Lumped-Element Resonators (AWLRs)," IEEE Trans. Circuits Syst. II: Express Briefs, vol. 63, No. 1, Jan. 2016, pp. 79-83. DOI: 10.1109/TCSII.2015.2505078.

Rais-Zadeh, Mina et al., "Reconfigurable Radios: A Possible Solution to Reduce Entry Costs in Wireless Phones," Proc. IEEE, vol. 103, Issue 3, Mar. 2015, pp. 438-451. DOI: 10.1109/JPROC.2015. 2396903.

Reinhardt, Alexandre et al., "Tunable composite piezoelectric resonators: a possible 'Holy Grail' of RF filters?," IEEE/MTT-S International Microwave Symposium, Jun. 17-22, 2012, 3 pages.

Ruby, Rich "A Snapshot in Time. The Future in Filters for Cell Phones," IEEE Microwave, vol. 16, Issue 7, Aug. 2015, pp. 46-59. DOI: 10.1109/MMM.2015.2429513.

Ruppel, Clemens "Acoustic Wave Filter Technology—A Review," IEEE Trans. Ultrason., Ferroelect., Freq. Contr, Apr. 4, 2017, pp. 1390-1400, DOI: 10.1109/TUFFC.2017.2690905.

Ud Din, Imad et al., "Two Tunable Frequency Duplexer Architectures for Cellular Transceivers," IEEE Transactions on Circuits and Systems I: Regular Papers, vol. 64, Issue 11, Nov. 2017, pp. 2988-2999.

Van Liempd, Barend et al., "A +70 dBm IIP3 Electrical-Balance Duplexer for Highly-Intergated Tubable Front-Ends," IEEE Transactions on Microwave Theory and Techniques, vol. 64, Issue 12, Dec. 2016, pp. 4274-4286.

Wada, T., et al., "A Miniaturized Broadband Lumped Element Circulator for Reconfigurable Front-end System," 2014 IEEE MTT-S Int. Microwave Symp. Digest, session WEP-28, Jun. 1-6, 2014, 3 pages.

Warder, Phil, "Golden Age for Filter Design. Innovative and Proven Approaches for Acoustic Filter, Duplexer, and Multiplexer Design," IEEE Microwave, vol. 16, Issue 7, Aug. 2015, pp. 60-72. DOI: 10.1109/MMM.2015.2431236.

Carpentier, J.F., et al., "A Tunable Bandpass BAW-Filter Architecture and Its Application to WCDMA Filter", IEEE Radio Frequency Integrated Circuits Symposium, Jun. 15, 2008, 107, pp. 221-224.

Chen, Jay et al., "In-line process monitoring of advanced packaging process using focused beam ellipsometry", Chip Scale Review, May-Jun. 2015, pp. 34-38.

Lau, John H. "Evolution and Outlook of TSV and 3D IC/Si Integration", 12th IEEE Electronics Packaging Technology Conference, Dec. 8-10, 2010, pp. 560-570.

Nishihara, Tokihiro et al., "BAS/SAW/IPD hybrid type duplexer with Rx balanced output for WCDMA Band I", IEEE MTT-S International Microwave Symposium Digest, Jun. 15-20, 2008, pp. 831-834.

Siemens AG "Integrate IC Chips and Passives Components with TSV for Sip", Ip.com, Prior Art Database, Technical Disclosure, IP.Com No. IPCOM000174770D, Oct. 13, 2008, 2 pages.

Zhou, Chong et al., "Design of GSM/DCS Dual-Band Bulk Acoustic Wave Coupled Resonator Filter with Unified Input", IEEE Symposium on Piezoelectricity, Acoustic Waves and Device Applications (SPAWDA), Shenzhen, China, Dec. 9-11, 2011, 4 pages.

Frederick, Amanda A., et al., "Frequency tuning of film bulk acoustic resonators," Proceedings of SPIE Smart Structures and Materials + Nondestructive Evaluation and Health Monitoring, San Diego, CA, US, Mar. 31, 2006, 10 pages.

El Hassan, M., et al., "Techniques for Tuning BAW-SMR Resonators for the 4th Generation of Mobile Communications," INTECH Open Science Open Minds, Chapter 18, http://dx.doi.org/10.5772/55131, Aug. 28, 2013, 22 pages.

Garrison, J.L., et al., "Bell System Technical Journal," American Telephone and Telegraph Co., New York, U.S., vol. 53, No. 10, pages, Dec. 1974, pp. 2203-2248.

Lakin, K.M., "Thin Film Resonator Technology," IEEE International Frequency Control Symposium and PDA Exhibition Jointly with the 17th European Frequency and Time Forum, New York, May 4, 2003, pp. 765-778.

Shirakawa, A. A., et al., "Bulk Acoustic Wave Coupled Resonator Filters Synthesis Methodology", IEEE European Microwave Conference, Oct. 4-6, 2005, 4 pages.

Shirakawa, Alexandre A., et al., "A Mixed Ladder-Lattice Bulk Acoustic Wave Duplexer for W-CDMA Handsets", IEEE International Conference on Electronics, Circuits and Systems, Dec. 11-14, 2007, 4 pages.

Sun, X., et al., "3D stack packaging solution for BAW devices—3D packaging demonstrator and RF performance", EPCOS AG, IEEE Proceedings of the European Solid-State Device Research Conference, Sep. 12-16, 2011, 4 pages.

Volatier, A., et al., "Design, elaboration and characterization of Coupled Resonator Filters for WCDMA applications", IEEE Ultrasonics Symposium, Oct. 2-6, 2006, 4 pages.

* cited by examiner

TUNABLE RESONATOR ELEMENT, FILTER CIRCUIT AND METHOD

This application claims the benefit of U.S. Provisional Application No. 62/595,898, filed on Dec. 7, 2017, and the benefit of U.S. Provisional Application No. 62/641,664, filed on Mar. 12, 2018, and claims priority to European Application No. 18210369.7, filed Dec. 5, 2018 that also claims priority to U.S. Provisional Applications 62/595,898 and 62/641,664, which applications are hereby incorporated herein by reference in their entireties.

CROSS-REFERENCE TO RELATED APPLICATIONS

This application relates to the following co-pending and commonly assigned patent applications: U.S. patent application Ser. No. 16/210,610, filed on Dec. 5, 2018; U.S. patent application Ser. No. 16/210,582, filed on Dec. 5, 2018; U.S. patent application Ser. No. 16/210,703, filed on Dec. 5, 2018, U.S. patent application Ser. No. 16/210,732, filed on Dec. 5, 2018, U.S. patent application Ser. No. 16/210,555, filed on Dec. 5, 2018, U.S. patent application Ser. No. 16/210,788, filed on Dec. 5, 2018, U.S. patent application Ser. No. 16/210,637, filed on Dec. 5, 2018, U.S. patent application Ser. No. 16/210,637, filed on Dec. 5, 2018, U.S. patent application Ser. No. 16/210,670, filed on Dec. 5, 2018, which applications are incorporated herein by reference in their entirety.

TECHNICAL FIELD

The present application relates to tunable resonator elements, filters using such tunable resonator elements and corresponding methods.

BACKGROUND

Filters are used in a variety of electronic circuits to filter out certain frequency components of a signal while letting other frequency components pass. For example, in communication circuits filters may be used to block frequency components outside a frequency band or part of a frequency band used for communication and to be processed by further circuits.

To increase bandwidth, communication standards like wireless communication standards (e.g. LTE, Long-Term Evolution) or also wire-based communication standards continually increased a used frequency range and a number of used frequency bands. In communication devices implementing such standards, often highly selective filters matched to the respective frequency bands are required. The frequency bands used may differ from country to country. Therefore, a plurality of filters having different filter characteristics (for example different passbands) is required. Furthermore, in what is referred to as carrier aggregation several frequency bands are operated at the same time. This requires specific filter designs for exactly those combinations. With a specific filter provided for each possible combination, the number of physical filters is actually much higher than the number of available bands. In order to reduce the number of different filters (two-port up to n-port filters) actually required in a communication device, tunable filters are highly desirable.

As highly selective band pass filters in communication circuits and devices, surface acoustic wave (SAW) or bulk acoustic wave (BAW) technologies are frequently used. Conventional filters of such types are designed for fixed resonance or center frequencies. As a consequence, many filters are required to serve individual frequency bands or aggregated combinations of several frequency bands used in current communication standards like LTE, including WiFi. Radio frequency (RF) switches are then used to select individual filters of the plurality of filters for example for a desired signal path between an antenna and a low noise amplifier or power amplifier. Therefore, in such conventional approaches a large number of mostly discrete components is required, increasing circuit complexity, radio frequency losses, manufacturing complexity and the needed space for radio frequency front ends in communication devices. Space is limited in mobile devices such as smartphones, and therefore tunable solutions are highly desired to save area.

Some approaches have been made to make such SAW or BAW filters tunable in order to decrease the overall number of filters required. However, conventional tuning techniques may have drawbacks regarding their tuning range, their selectivity and/or regarding losses introduced by the possibility of tuning the filter. Therefore, it is an object to provide improved possibilities for filter tuning.

SUMMARY

In accordance with an embodiment, a resonator element for a filter includes a first resonator having a first terminal and a second terminal for coupling to a filter structure; a second resonator having a third terminal and a fourth terminal, where the second resonator is acoustically coupled to the first resonator; and a tuning circuit coupled to the third and fourth terminals. In one embodiment, a third resonator is coupled to the first resonator. In one embodiment, the tuning circuit includes at least one of a variable capacitor and an inductor.

In accordance with another embodiment, an RF filter device, includes a signal input; a signal output; a plurality of series resonator elements coupled between the signal input and the signal output, wherein each series resonator element comprises a first resonator having a first terminal and a second terminal, a second resonator having a third terminal and a fourth terminal, wherein the second resonator is acoustically coupled to the first resonator, and a tuning circuit coupled to the third and fourth terminals; and a plurality of shunt resonator elements coupled to the plurality of series resonator elements, wherein each shunt resonator element comprises a first resonator having a first terminal and a second terminal, a second resonator having a third terminal and a fourth terminal, wherein the second resonator is acoustically coupled to the first resonator, and a tuning circuit coupled to the third and fourth terminals.

In accordance with another embodiment, an RF integrated circuit filter includes a substrate; an insulating layer arranged on the substrate; a plurality of filter resonators arranged in the insulating layer including a patterned top electrode layer, a patterned piezoelectric layer, and a patterned bottom electrode layer, wherein at least two of the plurality of filter resonators are coupled together with the patterned top electrode layer; an acoustic coupling layer arranged on the plurality of filter resonators; and a plurality of tuning resonators arranged on the acoustic coupling layer and correspondingly located above each of the plurality of filter resonators.

In accordance with another embodiment, an RF filter device includes a signal input; a signal output; and a resonator element coupled between the signal input and the signal output, wherein the resonator element comprises a first resonator, a second resonator above the first resonator, wherein the second resonator is acoustically coupled to the first resonator, a third resonator below the first resonator, wherein the third resonator is acoustically coupled to the first resonator, a first tuning circuit coupled to second resonator; and a second tuning circuit coupled to the third resonator.

In accordance with another embodiment, an RF filter includes a substrate; an insulating layer on the substrate; a plurality of filter resonators in the insulating layer including a patterned top electrode layer, a patterned piezoelectric layer, and a patterned bottom electrode layer, wherein at least two of the plurality of filter resonators are coupled together with the patterned top electrode layer and at least two of the plurality of filter resonators are coupled together with the patterned bottom electrode layer; an acoustic coupling layer on the plurality of filter resonators; a plurality of tuning resonators on the acoustic coupling layer correspondingly located above each of the plurality of filter resonators; and a plurality of tuning circuits coupled to the plurality of tuning resonators, wherein each tuning circuit comprises a variable capacitor and an inductor.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

In the following, various embodiments will be described in detail referring to the attached drawings. It should be noted that these embodiments serve illustrative purposes only and are not be construed as limiting. For example, while embodiments may be described as comprising a plurality of features, elements or details, in other embodiments some of these features, elements or details may be omitted and/or may be replaced by alternative features, elements or details. In addition to the features, elements or details explicitly described, other features, elements or details, for example components conventionally used in bulk acoustic waves (BAW)-based filters, may be provided.

Features from different embodiments may be combined to form further embodiments unless noted to the contrary. Variations or modifications described with respect to one of the embodiments may also be applicable to other embodiments unless noted otherwise.

Embodiments discussed in the following relate to bulk acoustic wave (BAW) resonator elements which may be used to build a BAW-based filter. For forming BAW resonators, generally a piezoelectric layer is provided between two electrodes. The application of an electric field between the two electrodes generates a mechanical stress that is further propagated through the bulk of the structure as an acoustic wave. A resonance condition is established when the acoustical path and thickness direction of the structure corresponds to integer multiples of half the acoustic wave length.

In embodiments, at least two resonators are used which are acoustically coupled to each other to form a resonator element. A first resonator of the two resonators has terminals to be incorporated in a filter structure. A second resonator is coupled to a tuning circuit. Via the tuning circuit, the position of resonances of the resonator element may be modified.

Figure 1:
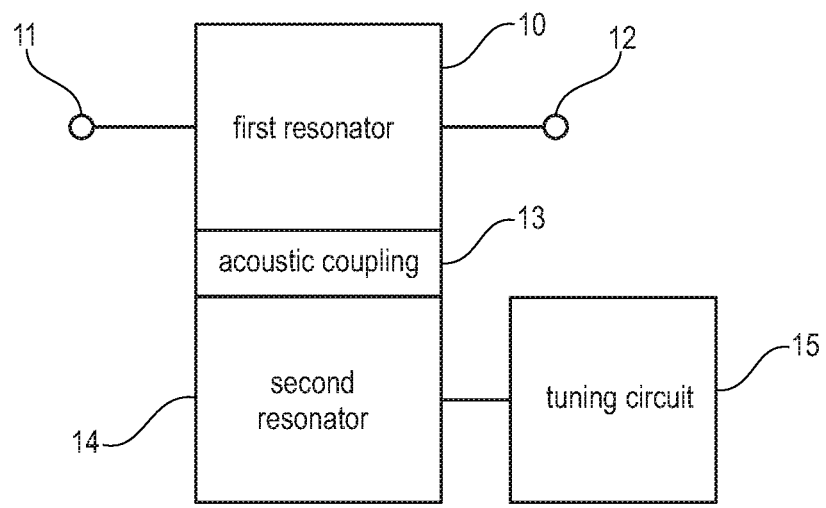
FIG. 1 is a schematic block diagram of a resonator element according to an embodiment.

In addition, in some embodiments the first resonator may be coupled to a further tuning circuit FIG. 1 schematically illustrates such a resonator element according to an embodiment. The resonator element of the embodiment of FIG. 1 comprises a first resonator 10 which is coupled with a second resonator 14 via an acoustic coupling 13. Acoustic coupling means in this context that acoustic waves of first resonator 10 may at least partially propagate to second resonator 14 and vice versa. Such an acoustic coupling between resonators may for example be implemented using a dielectric material.

First resonator 10 has a first terminal 11 and a second terminal 12. Using first and second terminals 11, 12 which may for example correspond to or be coupled to electrodes of first resonator 10, the resonator element of FIG. 1 may be incorporated in a filter structure like a ladder filter structure or a lattice filter structure.

Furthermore, a tuning circuit 15 is coupled to second resonator 14. Tuning circuit 15 may comprise an impedance network, which may comprise variable elements like variable impedances, for example a variable capacitor, or switches like radio frequency (RF) switches. By changing a value of the variable element(s) of tuning circuit 15, resonances of the resonator element of FIG. 1 may be shifted. This may be used for building a tunable filter using one or more resonator elements as shown in FIG. 1.

It should be noted that in contrast to some conventional approaches, tuning circuit 15 is electrically decoupled from first resonator 10 and acts on the first resonator 10 only via second resonator 14 and acoustic coupling 13. In some embodiments, this avoids adverse effects compared to tuning circuits directly coupled to first resonator 10.

In some embodiments, first resonator 10 and second resonator 14 may be similar resonator structures using similar materials. In other embodiments, different materials may be used. For example, in an embodiment for first resonator 10 a material with a comparatively low piezoelectric coupling may be used, for example aluminum nitride (AlN). This allows for building filters having a small bandwidth. On the other hand, in embodiments, second resonator 14 may be build based on a material having a comparatively high piezoelectric coupling, for example lithium niobate (LiNbO$_3$) or potassium niobate (KNbO$_3$) or Sc-doped aluminum nitride or aluminum scandium nitride AlScN. This in some embodiments allows for a high tuning range. In some embodiments, the piezoelectric coupling constant $k_{T^2}$ for the piezoelectric material of the first resonator may be below 30%, for example below 20% or below 10%, while the piezoelectric coupling constant $k_{T^2}$ the second resonator may be above 10%, for example above 20%, for example above 30% or above 40%. The piezoelectric (electromechanical) coupling constant $k_{T^2}$ may be calculated from the tensor properties of the respective piezoelectric material, i.e. from elastic stiffness or compliance coefficients, dielectric coefficients, and piezoelectric coefficients. Constant $k_{T^2}$ is also referred to as a piezoelectric coupling constant for a transversely clamped material; $k_{T^2}$ may be defined as $k_{T^2}=K^2/(1+K^2)$, where piezoelectric coupling constant $K^2$ is defined as $K^2=e^2/(\varepsilon^S c^E)$, e is the piezoelectric material coefficient, $\varepsilon^S$ the dielectric material coefficient and $c^E$ is the elastic material coefficient of the respective piezoelectric material used.

The piezoelectric coupling constant $k_{T^2}$ is a measure for the relative bandwidth of an (ideal) piezoelectric resonator. Therefore, in embodiments combinations of different materials for first resonator 10 and second resonator 14 allow on the one hand a small bandwidth, as required for some communication applications, and on the other hand allows for a comparatively wide tuning range. Using an aluminum nitride based resonator as first resonator 10 in embodiments additionally provides a good thermal conduction capable of transporting heat, which may be important for some applications to be able to prevent overheating. However, the above materials are to be taken merely as examples, and other materials may also be used.

First resonator 10 may also be referred to as filter resonator, as it is to be incorporated into a filter structure using first and second terminals 11, 12. Second resonator 14 may also be referred to as a frequency tuning resonator, as it is used for tuning resonance frequencies of the resonator element of FIG. 1 using tuning circuit 15.

First resonator 10, acoustic coupling 13 and second resonator 14 may be implemented in a single material stack using existing process flows.

Figure 2:
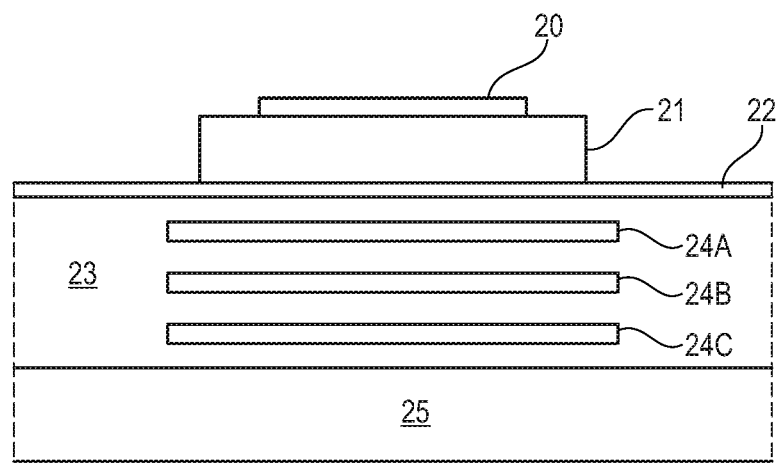
FIG. 2 is a schematic cross-sectional view illustrating implementation of a resonator.

Corresponding stack structures will be discussed next with reference to FIGS. 2 and 3. As an introduction, FIG. 2 shows a resonator element with a single resonator for explanatory purposes. Then, referring to FIG. 3 a resonator stack comprising first and second resonators (for example resonators 10, 14 of FIG. 1) will be explained.

FIG. 2 illustrates a cross-sectional view of a bulk acoustic wave (BAW) resonator. The resonator itself comprises a piezoelectric material 21 sandwiched between a top electrode 20 and a bottom electrode 22. Top electrode 20 and bottom electrode 22 may each be formed by one or more metal layers.

Instead of single resonator as illustrated in FIG. 2, in some embodiments a resonator stack comprising a first resonator and a second resonator is provided, as will be explained in below in FIG. 3.

In the embodiment of FIG. 2, for acoustic isolation of the resonator a so-called acoustic mirror is placed below the resonator. The acoustic mirror of FIG. 2 comprises a sequence of layers with alternating low and high acoustic impedances. For example, in FIG. 2 numeral 23 designates a material with a comparatively low acoustic impedance, whereas 24A to 24C designate layers with a comparatively high acoustic impedance, leading to alternating layers of low and high acoustic impedance below the resonator 20, 21, 22. Each individual layer (portions of material 23 between layers 24A, 24B, 24C, electrode 22 and a substrate 25 as well as layers 24A to 24C themselves) in embodiments has a thickness of approximately λ/4, λ being the acoustic wavelength of a longitudinal wave within the layer. In this respect, it should be noted that λ depends on the respective layer material. This acoustic mirror structure acoustically decouples the resonator from the supporting substrate 25. Instead of such an acoustic mirror, in other embodiments also a cavity may be provided. The cavity may be directly underneath the bottom electrode 22, or under a thin membrane which supports the resonator structure 20/21/22.

The resonance frequencies of a resonator as illustrated in FIG. 2 comprising top electrode 20, piezoelectric material 21 and bottom electrode 22 depends on the thicknesses of all these discussed layers, where the piezoelectric layer thickness has the largest influence, followed by electrode thicknesses. Therefore, in case of FIG. 2 in the absence of further circuits influencing the frequency the resonance frequencies of the resonator are fixed for a specific combination of materials and layer thicknesses and may be changed only by physically changing the structure, for example using processing steps like deposition or etching (as global measures or as local measures defined by lithography).

Figure 3:
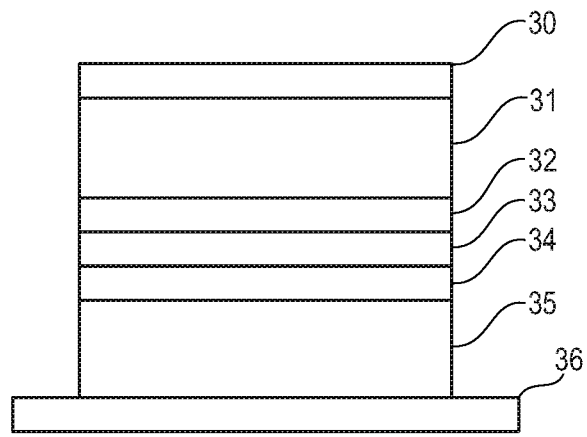
FIG. 3 is a schematic cross-sectional view of a resonator stack usable in embodiments.

FIG. 3 illustrates a resonator stack usable in embodiments. The resonator stack of FIG. 3 in embodiments may for example replace the resonator 20-22 in the cross-sectional view of FIG. 2.

The resonator stack of FIG. 3 comprises a first resonator formed by a first piezoelectric material 31 sandwiched between a first top electrode 30 and a first bottom electrode 32. Furthermore, the resonator stack 3 comprises a second resonator formed by a second piezoelectric material 35 sandwiched between a second top electrode 34 and a second bottom electrode 36. First and second resonators are separated by one or more layers 33 providing acoustic coupling and in some embodiments also electrical isolation. Layers 33 may be formed of one or more dielectric layers. Layers 33 may also comprise a combination of dielectric and conductive (e.g. metal) layers. In embodiments where electric isolation between bottom electrode 32 and top electrode 34 is required (as it is the case for series resonator elements), the one or more layers 33 comprise at least one dielectric (electrically non-conducting) layer. Whether electrically isolating or not, the one or more layers (e.g. layer stack) 33 always provides an acoustical coupling between the first and the second resonator.

Electrodes 30, 32, 34 and 36 each may for example comprise one or more metal layers like aluminum layers, copper layers or wolfram layers, but are not limited thereto. First piezoelectric material 31 and second piezoelectric material 35 in some embodiments may be the same materials. Nevertheless, in some embodiments different materials may be used. For example, as already explained with reference to FIG. 1, first piezoelectric material 31 may be a material with a comparatively low piezoelectric coupling, for example aluminum nitride, and first resonator may serve as a filter resonator as explained above to build a filter having a comparatively narrow bandwidth. An aluminum nitride piezoelectric layer like layer 31 may for example be produced by reactive sputtering from an Al target. Second piezoelectric material 35 may comprise a material having a comparatively high piezoelectric coupling, for example lithium niobate, potassium niobate or Sc-doped aluminum nitride, to provide a large tuning range. Note that Sc-doped AlN layers may also be formed as so-called AlScN layers which may contain a significant amount of Sc. In other embodiments, both piezoelectric layers 31, 35 may be aluminum nitride based, but with different dopants and/or dopant concentration for example different scandium (Sc) concentrations.

It should be noted that in order to properly couple the first and the second resonator, in embodiments the piezoelectric materials of both resonators piezoelectrically couple to a same type (polarization) of acoustic waves. The piezoelectric couplings generally depend on the material but also on the used crystal orientation. The tuning circuit of the second resonator in embodiments may only influence the frequency behavior of the first resonator if both piezoelectric layers couple to the same acoustic wave type/polarization. For example, when sputtered aluminum nitride piezoelectric materials are used, the piezoelectric layer 35 is used in a cut (crystal orientation) offering a strong piezoelectric coupling of the same polarization as piezoelectric layer 31.

For example, in embodiments where aluminum nitride is used in first piezoelectric layer 31 or second piezoelectric layer 35, aluminum nitride may be deposited in c-axis orientation on the substrate material. As substrate material (for example substrate 25 of FIG. 2), a silicon wafer or a lithium niobate ($LiNbO_3$) or lithium tantalate ($LiTaO_3$) crystal may be used.

Figure 4:
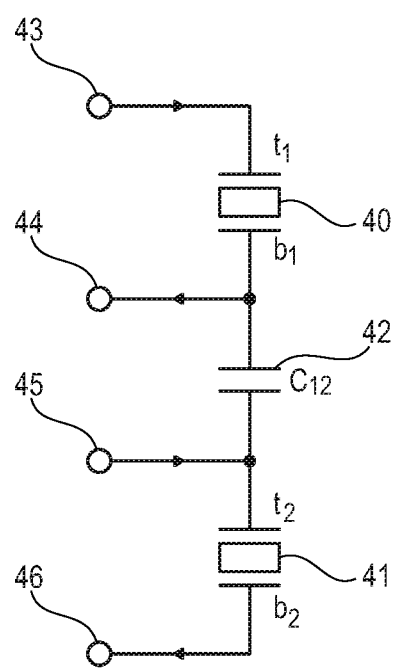
FIG. 4 is an example equivalent circuit of the resonator stack of FIG. 3.

FIG. 4 illustrates an equivalent circuit of the layer stack of FIG. 3. Numeral 40 denotes the first resonator, formed in FIG. 3 by layers 30, 31 and 32, and 41 denotes the second resonator, formed by layers 34, 35 and 36 in FIG. 3. A terminal 43 contacts the first top electrode (30 of FIG. 3, also labelled $t_1$ in FIG. 4), a terminal 44 electrically contacts the first bottom electrode (32 in FIG. 3, also labelled $b_1$), a terminal 45 contacts the second top electrode (34 in FIG. 3, also labelled $t_2$) and a terminal 46 electrically contacts the second bottom electrode (36 in FIG. 3, also labelled $b_2$).

A parasitic capacitor 42 with a capacitance $C_{12}$ is associated with the dielectric layer (stack) 33 between the first resonator's bottom electrode and the second resonators top electrode.

It should be noted that while in the embodiments of FIGS. 3 and 4 first bottom electrode 32 is electrically separate from second top electrode 34, in other embodiments when no separate terminals are needed also a single electrode may be provided serving both as second top electrode and first bottom electrode, and the acoustic coupling of the resonators is then via this common electrode. In this case, no dielectric layer for electrical separation is needed.

In embodiments, terminals 43 and 44 then serve to incorporate the resonator element of FIG. 4 into a filter structure. To provide frequency tuning, a tuning circuit may be coupled to terminals 45 and 46. Examples will be discussed next with reference to FIGS. 5 to 7.

Figure 5:
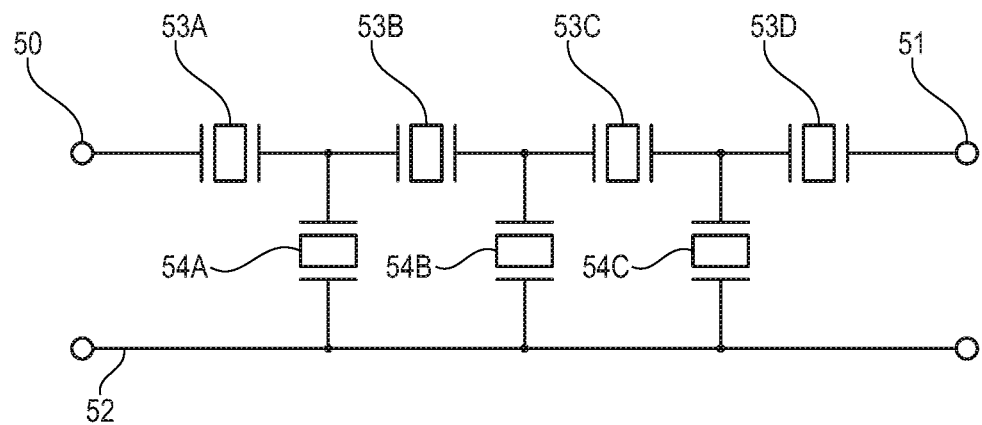
FIG. 5 is an example filter structure which may be implemented using resonator elements according to embodiments.

FIG. 5 illustrates an example topology of a ladder filter, in this case a 3½ stage ladder filter. Numeral 50 denotes a signal input, numeral 51 denotes a signal output and numeral 52 denotes a ground line. The ladder filter of FIG. 5 comprises four series resonators 53A to 53D and three shunt resonators 54A to 54C. Typically all series resonators 53A to 53D have the same resonance frequency, and all shunt resonators 54A to 54C have the same resonance frequencies, but the resonance frequencies of the series and the shunt resonators are detuned with respect to each other. The amount of detuning roughly corresponds to the bandwidth of the resulting filters. The resonance frequencies of the shunt resonators 54A to 54C in typical cases are lower than the resonance frequencies of the series resonators 53A to 53D.

Each of resonators 53A to 53D, 54A to 54C may be a first resonator of a resonator element as discussed previously with respect to FIGS. 1, 3 and 4. Via a tuning circuit coupled to the respective second resonator of the resonator elements, frequency tuning of the filter may be performed. The ladder filter structure of FIG. 5 serves only as an example, and any conventional ladder or lattice filter structures used with BAW resonators in the art may be used and modified by replacing resonators conventionally used by resonator elements comprising first and second resonators as explained with reference to FIGS. 1, 3 and 4. A plurality of such filters may be combined to form an n-port filter structure, for example for filtering a plurality of frequency bands used in communication applications.

Figure 6:
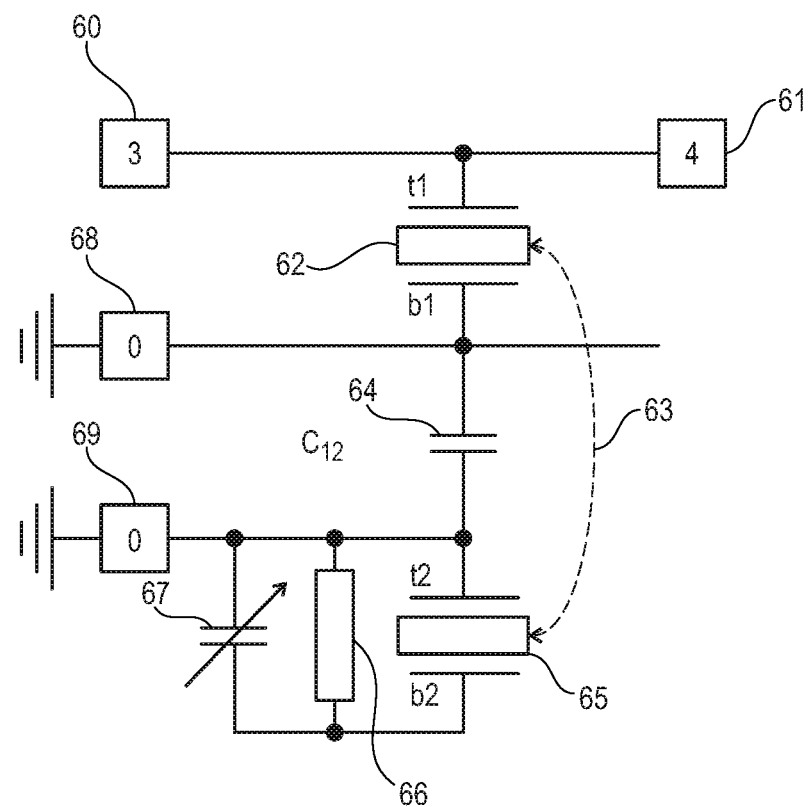
FIG. 6 is a circuit diagram of a resonator element according to an embodiment usable as shunt resonator element.

FIG. 6 illustrates a resonator element according to an embodiment comprising a tuning circuit and usable as shunt resonator element, for example to implement shunt resonators 54A to 54C of the ladder filter structure of FIG. 5.

The resonator element of FIG. 6 comprises a first resonator 62 with a first top electrode t1 and a first bottom electrode b1 and a second resonator 65 with a second top electrode t2 and a second bottom electrode b2. First resonator 62 and second resonator 65 are electrically isolated (but not acoustically decoupled) e.g. by a dielectric material represented by a parasitic capacitance 64. This dielectric material provides an acoustic coupling between the resonators 62, 65 as indicated by an arrow 63. Implementation of first resonator 62 and second resonator 65 may be as explained previously with respect to FIGS. 1, 3 and 4.

First top electrode t1 of first resonator 62 is coupled to a first terminal 6o (also labelled "3") and a second terminal 61 (also labelled "4"). Terminals 60, 61 serve for connection with further resonators or signal input/output terminals to build filter structures. For example, when the shunt resonator element of FIG. 6 is used for implementing the shunt resonator 54A of FIG. 5, first terminal 60 is coupled with series resonator 53A and second terminal 61 is coupled with series resonator 53B.

First bottom electrode b1 of first resonator 62 is coupled to ground via a terminal 68, also labelled "0". In the example filter structure of FIG. 5, this corresponds to the coupling of any one of shunt resonators 54A to 54C to ground line 52.

Second top electrode t2 of second resonator 65 is coupled to ground via a terminal 69 also labelled "0".

Furthermore, a tuning circuit is coupled between second top electrode t2 and second bottom electrode b2 of second resonator 65. In the example of FIG. 6, the tuning circuit comprises a variable capacitor 67 coupled in parallel to an inductance 66. Inductance 66 in some embodiments may be implemented as a high Q (Quality-factor) inductor or other reactance, e.g. having a Q-factor of more than 10, more than 50 or more than 100. An inductivity L1 of the inductor may for example be between 0.5 and 200 nH, for example below 50 nH, e.g. between 1 and 10 nH. Variable capacitor 67 may be implemented in any conventional manner using for example varactors or switched capacitors. By changing the capacitance value of variable capacitor 67, resonances (series resonance and parallel resonance) of the resonator element of FIG. 6 may be tuned. The tuning circuit of FIG. 6 is only an example, and various combinations of capacitances, inductors and/or resistors may be used, one or more of these capacitances, inductors and/or resistors being variable to provide a tuning. In some embodiments, the tuning circuit may also comprise switches like radio frequency (RF) switches that may be selectively opened and closed to tune the resonator element. In such tuning circuits, capacitances or inductivities may be coupled in series or parallel to the switch or switches, (e.g. RF switch or switches).

As will be explained later in more detail using simulation results, an inductance 66, e.g. an inductor, may increase a tuning range compared to a case where only a variable capacitor is used.

Figure 7:
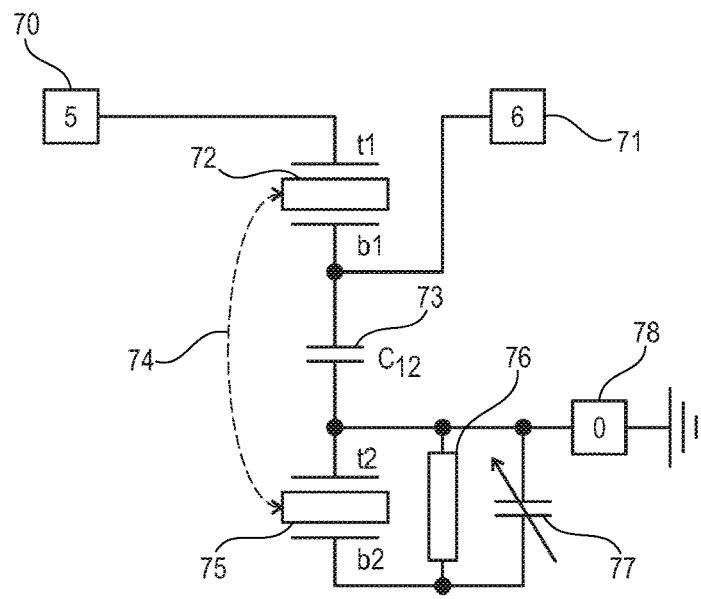
FIG. 7 is a circuit diagram of a resonator element according to an embodiment usable as series resonator element.
Figure 8:
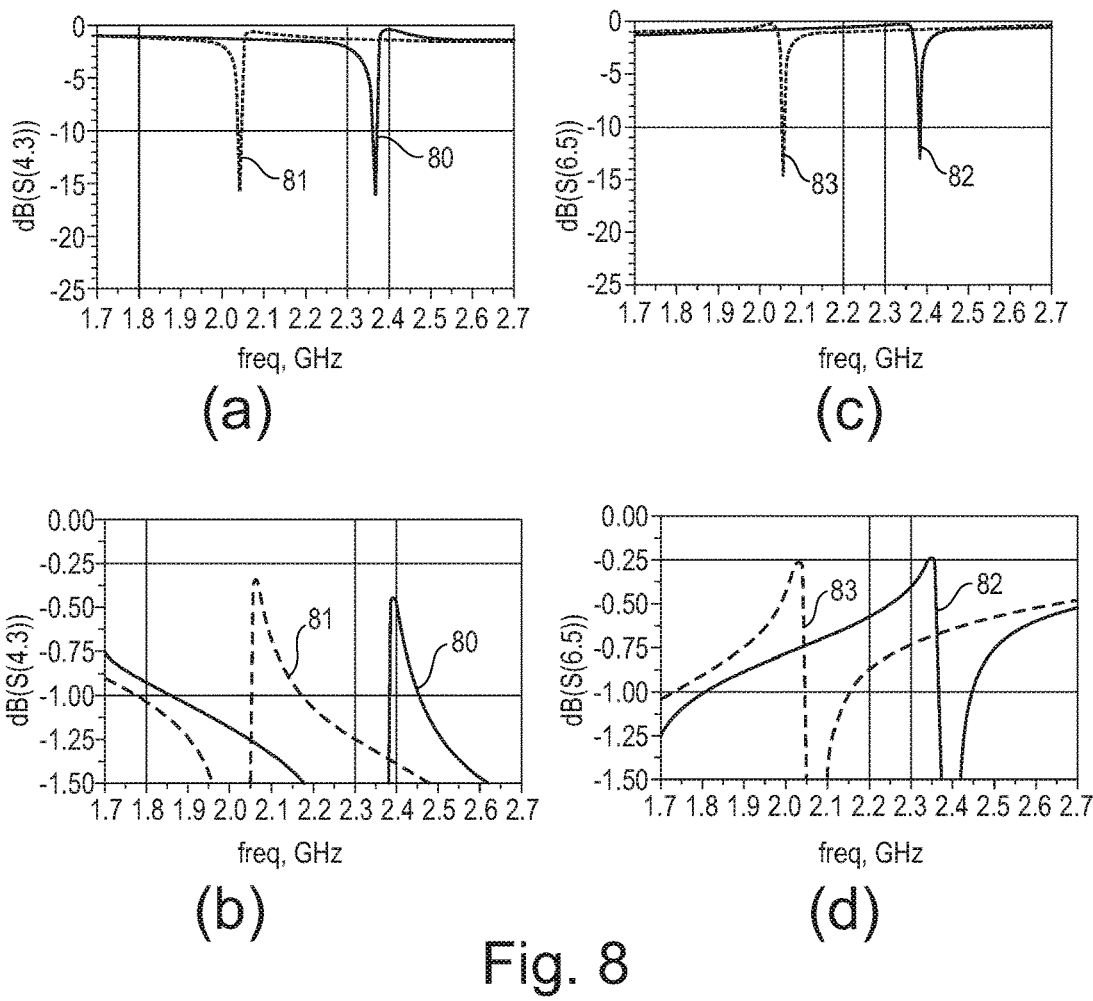
FIGS. 8(*a*)-8(*d*), 9(*a*)-9(*d*), 10(*a*)-10(*d*), 11, 12, and 13 illustrate simulation results to illustrate operation of embodiments.
Figure 9A:
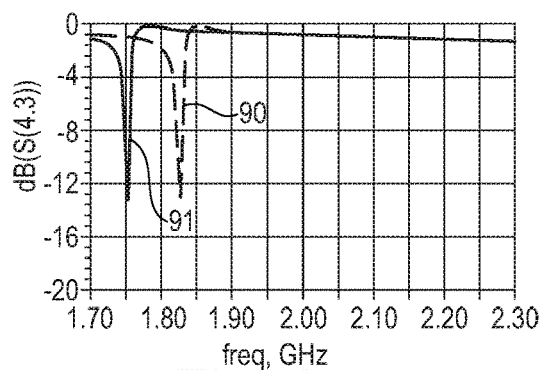
Figure 9C:
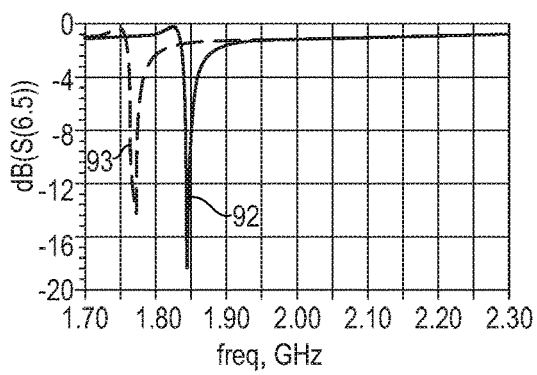
Figure 9B:
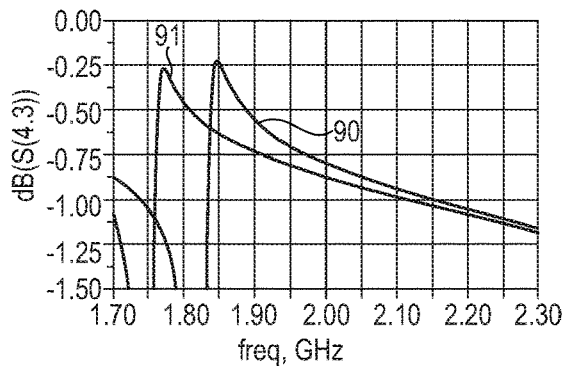
Figure 9D:
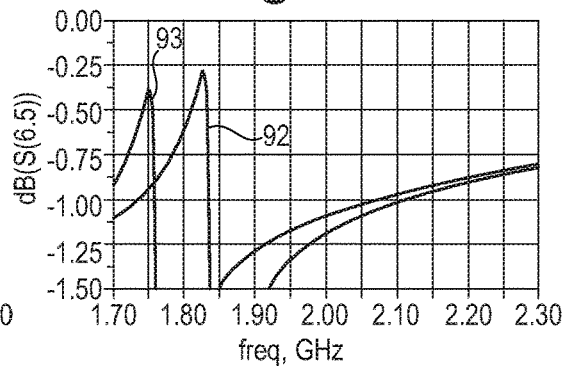
Figure 10A:
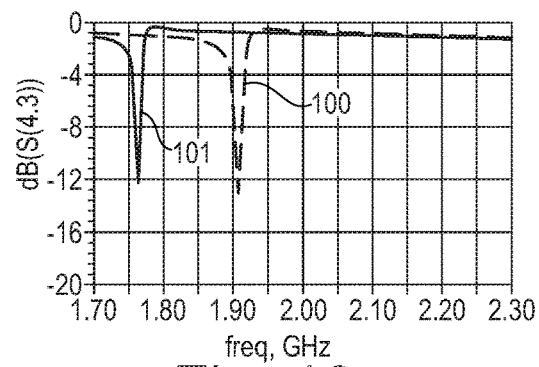
Figure 10C:
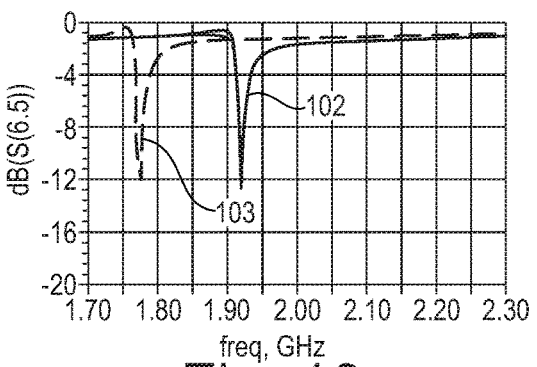
Figure 10B:
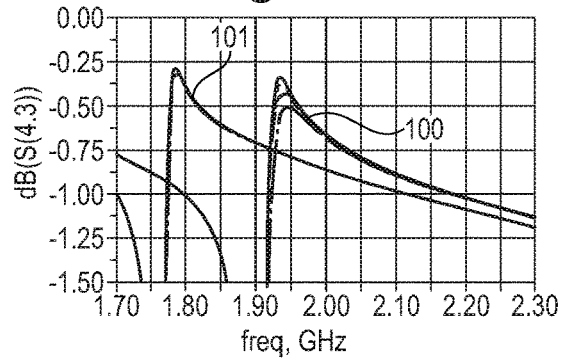
Figure 10D:
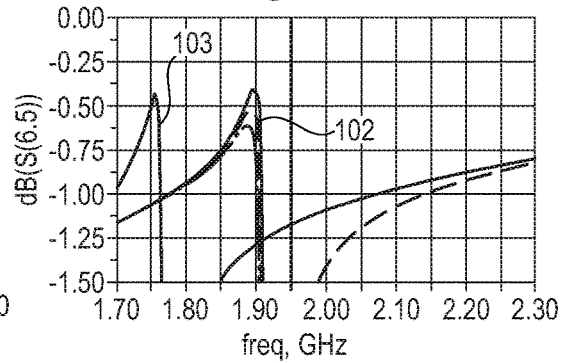
Figure 11A:
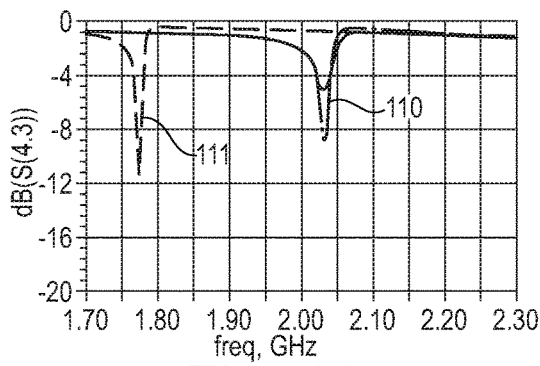
Figure 11C:
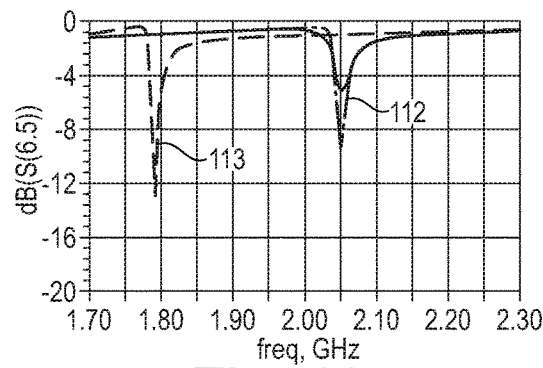
Figure 11B:
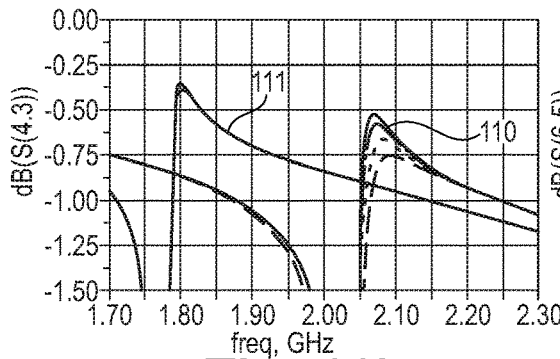
Figure 11D:
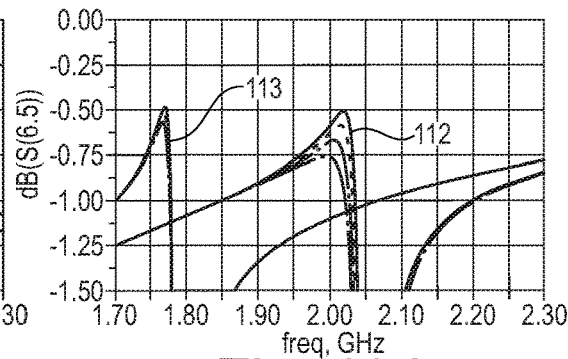
Figure 12A:
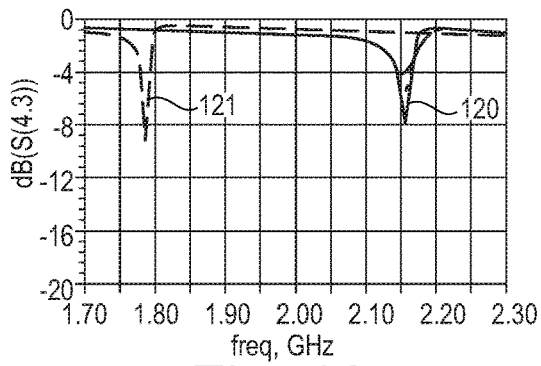
Figure 12C:
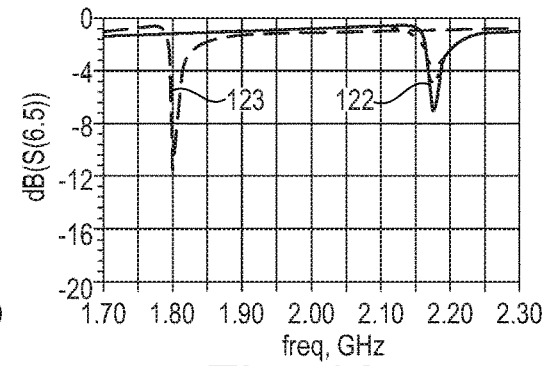
Figure 12B:
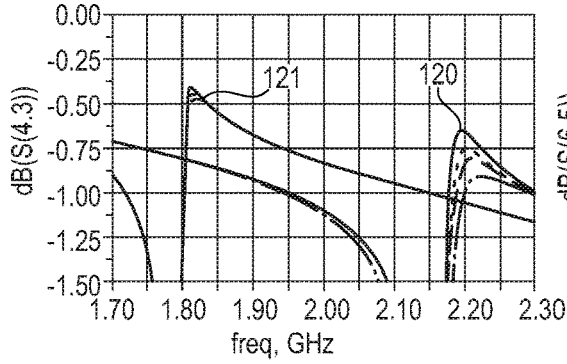
Figure 12D:
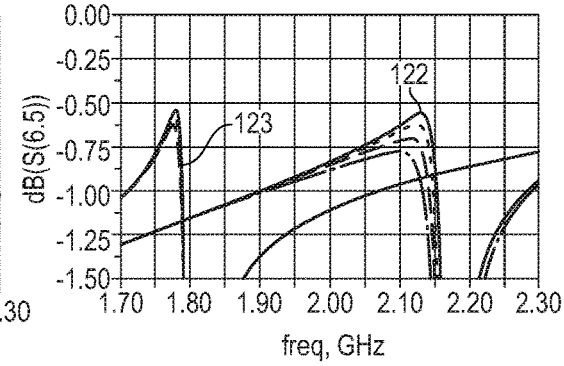

FIG. 7 is a circuit diagram of a resonator element suitable as a series resonator in filter structures like the filter structure of FIG. 5, for example for implementing series resonators 53A to 53D. The resonator element of FIG. 7 comprises a first resonator 72 and a second resonator 75 which are electrically separated as indicated by a (parasitic) capacitance 73, having a capacitance value $C_{12}$. Capacitance 73 is associated with some dielectric layer(s) that acoustically couples the first resonator 72 and the second resonator 75, as indicated by an arrow 74. First resonator 72 has a first top electrode t1 and a first bottom electrode b1, and second resonator 75 has a second top electrode t2 and a second bottom electrode b2. First and second resonators 72, 75 may be implemented as explained with reference to FIGS. 1, 3 and 4 above.

First top electrode t1 is coupled with a first terminal 70 also labelled "5", and first bottom electrode B1 is coupled with a second terminal 71, also labelled "6". Via first and second terminals 70, 71, the resonator element of FIG. 7 may be incorporated in a filter structure. For example, to implement series resonator 53A of FIG. 5, first terminal 70 would be coupled to signal input 50, and second terminal 71 would be coupled to resonators 54A and 53B. In case resonator 54A is implemented as in FIG. 6, for example second terminal 71 of FIG. 7 would be coupled with first terminal 60 of FIG. 6, and second terminal 61 of FIG. 6 would then be coupled with a corresponding terminal of resonator 53B.

Second top electrode t2 is coupled to ground via a terminal 78, also labelled "0". The designations 3, 4, 5 and 6 of terminals 60, 61, 70, 71 of FIGS. 6 and 7 will be used later in discussion of simulations referring to FIGS. 8 to 12, while terminals coupled to ground are also labelled "O" in FIGS. 6 and 7.

Furthermore, a tuning circuit is coupled to second top electrode t2 and second bottom electrode b2 comprising for example an inductance 76 and a variable capacitor 77. Impedance 76 and variable capacitance 77 may be implemented in a similar manner as explained for inductance 66 and variable capacitance 67 of FIG. 6, respectively. Furthermore, inductance 76 and capacitance 77 are merely one example for a tuning circuit coupled to second resonator 75, and as also explained for FIG. 6 other tuning circuit configurations are also possible.

With the shunt resonator element of FIG. 6 and the series resonator element of FIG. 7, various filter structures like lattice filters and ladder filters, for example the ladder filter structure of FIG. 5, may be built.

To illustrate functionality of resonator elements discussed above further, simulation results or various configurations will be discussed referring to FIGS. 8 to 12.

For the simulation of FIGS. 8 to 12, a first resonator (filter resonator) made of doped aluminum nitride (for example scandium doped or doped with another material) with a piezoelectric coupling constant $k_{T^2}$ of 7.1% was assumed, and for the second resonator (frequency tuning resonator) a LiNbO$_3$-crystal based resonator with a piezoelectric coupling constant $k_{T^2}$=25% was assumed.

FIGS. 8(a) to 8(d) show the S-parameter (scattering parameter, representing insertion loss) over frequency for various configurations. In FIGS. 8(a) and 8(b), the S-parameter is shown for a resonator element where the first resonator is coupled in a shunt configuration, as for example illustrated in FIG. 6. FIGS. 8(c) and 8(d) illustrate curves for a series coupling of a first resonator, as illustrated for example in FIG. 7. FIGS. 8(a) and 8(b) illustrate the same curves, with the y-axis being enlarged in FIG. 8(b) compared to FIG. 8(a), and likewise in FIG. 8(d) the y-axis is enlarged compared to FIG. 8(c). In FIGS. 8(a) and 8(b), a curve 80 shows the S-parameter for a tuning circuit comprising an impedance like impedance 66 of FIG. 6. The impedance in the simulation was inductivity of 1 nH with very high quality factor. Furthermore, a small capacitance 67 of 1 pF was assumed. A curve 81 illustrates the S-parameter with an additional capacitance of 10 pF in parallel to the impedance of curve 80. A large shift of the shown resonance of the order of 300 MHz is observed.

A curve 82 in FIGS. 8(c) and 8(d) illustrates the S-parameter for the series resonator case for a tuning circuit comprising an impedance formed by an inductivity of 1 nH with very high quality factor plus a small capacitance of 1 pF as capacitance, similar to curve 80 of FIGS. 8(a) and (b), and a curve 83 illustrates the behavior with an additional capacitance of 10 pF coupled in parallel to the impedance. Also here, a frequency shift of the resonance of the order of 300 MHz is observed.

Next, with reference to FIGS. 9 to 12, the influence of the inductivity of impedance 66 or 76 of FIGS. 6 and 7 will be explained. Similar to FIG. 8, in FIGS. 9 to 12 graphs (a) and (b) illustrate curves for a shunt resonator arrangement as illustrated in FIG. 6, and graphs (c) and (d) show the S-parameter for a series resonator configuration as illustrated in FIG. 7. Also, similar to FIG. 8, in graph (b) of FIGS. 9 through 12 the y-axis is enlarged compared to graph (a), and in graph (d) the y-axis is enlarged compared to graph (c). In each of the graphs of FIGS. 9 to 12, a curve (or set of curves) for a capacitance of 1 pF and a curve or set of curves for a capacitance of 10 pF is shown, similar to what was explained for FIG. 8.

In FIG. 9, impedance 66 and 76, respectively, of the tuning circuit has a value of 100 nH. Curves 90 and 92 show the S-parameter for a capacitance of 1 pF, and curves 91 and 93 show the S-parameter for a capacitance of 10 pF. The shown resonances are shifted by less than 100 MHz both for the shunt resonator case and for the series resonator case.

FIG. 10 shows the case for an inductivity of 3 nH. Curves 100 and 102 illustrate the S-parameter for a capacitance of 1 pF, and curves 101 and 103 illustrate the S-parameter for a capacitance of 10 pF. Each of curves 100 to 103 comprises a plurality of curves, visible in particular in the enlarged versions of graphs (b) and (d) for curves 91 and 93, respectively. These curves represent the behavior for different Q-factors (quality factors) of the inductivity, for a Q-factor range of 42 to 100. Generally, higher Q-factors lead to more pronounced resonances and reduced insertion loss. The resonances in this case are shifted by about 150 MHz.

FIG. 11 illustrates curves for an inductivity value of 1.7 nH. Curves 110 and 112 illustrate the S-parameter for a capacitance of 1 pF, and curves 111 and 113 illustrate the S-parameter for a capacitance of 10 pf. Individual curves of curves 110 to 113, visible in particular in the enlarged views of FIGS. 11(b) and (d) illustrate different Q-factors for the inductivity, again in the range of 42 to 200. Through the change of capacitance, the resonance is shifted by a little less than 300 MHz.

Finally, FIG. 12 illustrates a case with inductivity of 1.3 nH. Curves 120 and 122 illustrate the S-parameter for the capacitance of 1 pF, and curves 121, 123 illustrate the S-parameter for capacitance of 10 pF. Individual curves of curves 120 to 123 illustrate the behavior for different Q-factors. Here, the resonances are shifted by almost 400 MHz. As can be seen, therefore, by reducing the inductivity a larger frequency tuning range may be obtained with the same capacitance variants. However, the difference between different Q-factors becomes more pronounced with reduced inductivities, such that in embodiments using small inductivities below 5 nH high Q-factors above 100, for example above 150, may be selected for implementing the inductivity.

Figure 13:
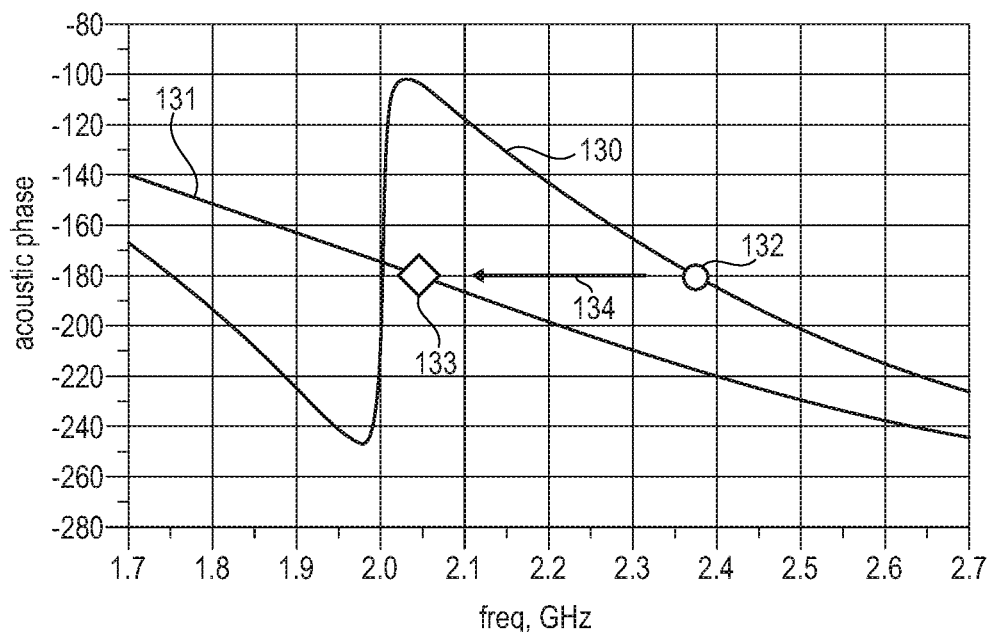

FIG. 13 illustrates the acoustic phase of a resonator stack configured as illustrated in FIG. 6 (shunt resonator configuration), with match intrinsic acoustic port terminations for the acoustic path illustrated by arrow 63. A curve 130 shows the phase with the tuning impedance 66, whereas a curve 131 shows the phase when capacitance 67 is additionally introduced. By changing the capacitance, therefore for example point 132 is shifted to point 133, leading to a tuning range as indicated by an arrow 134.

Figure 14:
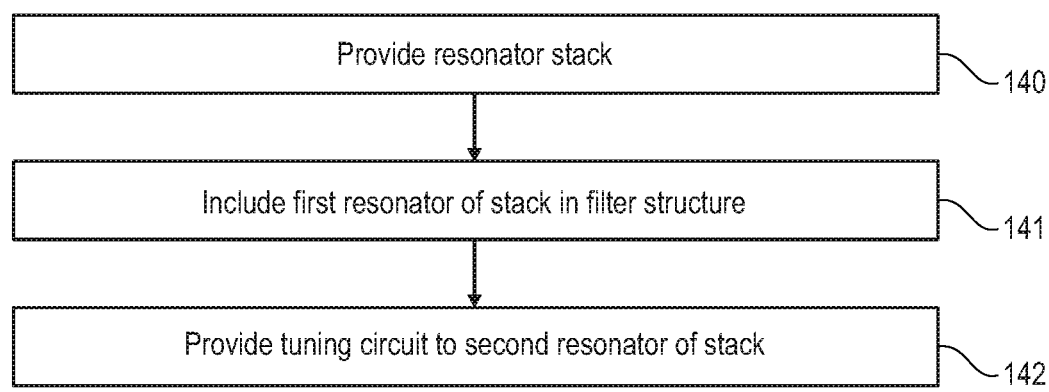
FIG. 14 is a flow chart illustrating a method according to an embodiment.

FIG. 14 illustrates a method according to an embodiment. While the method of FIG. 14 is described as a series of acts or events, the order in which these acts or events are described and shown is not to be construed as limiting. The method of FIG. 14 may be implemented using the resonator elements discussed above, and features, elements, variations and modifications described with respect to these resonator elements are also applicable to the method. For ease of reference, the method of FIG. 14 will be described referring to the previous description of resonator elements. However, the method of FIG. 14 may also be implemented independently from the resonator elements described previously.

At 140 in FIG. 14, a resonator stack is provided. Providing the resonator stack may for example include forming two stacked resonators on a substrate, for example stacked resonators as discussed and described with respect to FIG. 3. Providing the resonator stack may also include providing an acoustic mirror or a cavity below the resonators, as explained with reference to FIG. 2.

At 141, the method includes incorporating a first resonator of the resonator stack, for example the first resonator (filter resonator) of the previously discussed embodiments, in a filter structure. For example, the first resonator may be included in the filter structure as a shunt resonator or as a series resonator.

At 142, a tuning circuit is provided to a second resonator of the resonator stack, for example a tuning circuit comprising an inductor and a variable capacitor, as illustrated in FIGS. 6 and 7. By the tuning circuit, the resonator stack may then be tuned to a desired frequency for use in the filter structure. For example, via the tuning circuit the filter structure may be adapted to different frequency bands used in a communication device.

Frequency tunable RF filters using circuit topologies with frequency tunable bulk acoustic wave (BAW) resonators have been described herein. Possible filter circuit topologies are, for example, ladder or lattice filters. The individual resonators of any filter topology differ in their respective impedance levels or, equivalently, resonator areas. In order to build a tunable filter from tunable resonators, all resonators are ideally tunable (or programmable) in a similar manner in order to enable a uniform tuning/shifting of the filter curve shown in, for example, FIG. 8(a) to FIG. 13. Ideally, every tunable BAW resonator has a corresponding individual tuning network, which comprises tunable or programmable capacitors and/or inductors. Such passive components ideally offer high quality factors in order to minimize losses and maximize the resulting (bandpass) filter performance. A uniform frequency tuning/shifting of the individual resonators in a filter configuration is realized by respective tuning networks that are scaled according to the associated resonator impedances. The capacitors in a tuning network scale proportionally to the static capacitance of the respective resonator, whereas the inductors in a tuning network scale inversely proportional to the static capacitance of the respective resonator.

Any conventional RF filter with a topology based on fixed frequency (BAW) resonators can be converted into a tunable filter with the same topology but tunable/programmable (BAW) resonators are used instead of the fixed frequency (BAW) resonators of the conventional RF filter. Each tunable/programmable BAW resonator is controlled by an individual tuning network. The impedance of each tuning network scales proportionally to the impedance of the tuning resonator (within limits according to manufacturing tolerances and parasitic effects). Shunt resonators may be tuned differently from the series resonators in order to allow an adjustment of the bandwidth of the frequency-shifted filter curves.

Figure 16:
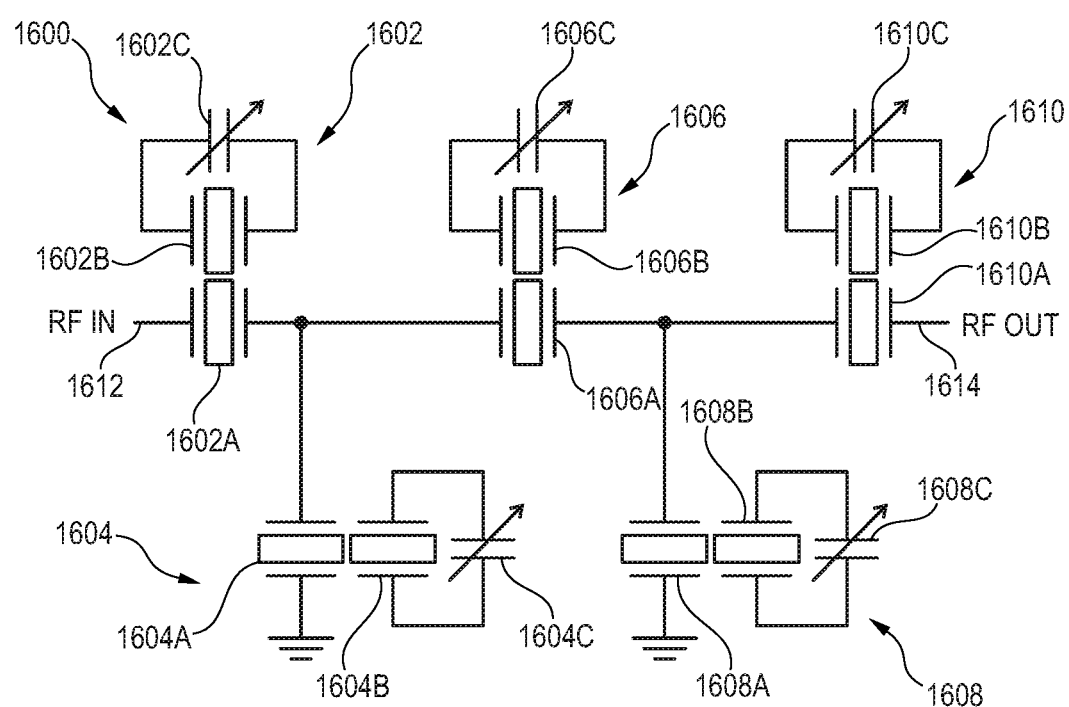
FIG. 16 is a schematic diagram of a 2½ stage ladder filter, wherein each resonator element includes a filter resonator and a corresponding tuning resonator coupled to a tuning circuit.

In general, a tunable RF ladder filter has N half stages where N≥2 is typically between 4 (e.g. 2 stages) and 7 (e.g. 3½ stages) or 8 (e.g. 4 stages). A single ladder filter stage comprises a series resonator and a shunt resonator. A half stage may either be a series resonator or a shunt resonator. A 3½ stage ladder filter may be realized with 4 shunt resonators and 3 series resonators or, alternatively, 3 shunt resonators and 4 series resonators. FIG. 16, described in further detail below, shows an example of a 2½ stage ladder filter. Note that a series or shunt resonator (half stage) may comprise more than one resonator in order to improve power handling capabilities, for example. Typically, all series resonators offer the same (series) layer stack, and all shunt resonators offer the same (shunt) layer stack. As a consequence, all series resonators offer similar resonance and anti-resonance frequencies. This is also true for all shunt resonators. For bandpass filters, the resonance frequencies of the shunt resonators are smaller than the respective resonance frequencies of the series resonators. (The opposite will result in bandstop filters). However, the areas of the individual resonators of a filter are different. The static capacitance of a resonator is proportional to its area, and the impedance function of the resonator is inversely proportional to its area. For a given layer stack, tunable/programmable BAW resonators of different areas, as described herein, offer the same frequency shifting when the impedance of their respective tuning network is proportional to the impedance of the tuning resonator. This kind of scaling of the tuning network's impedance with the static capacitance (or area) of the respective tuning resonator is one element for realizing frequency tunable (programmable) filters from individual frequency tunable (programmable) resonators.

Figure 15:
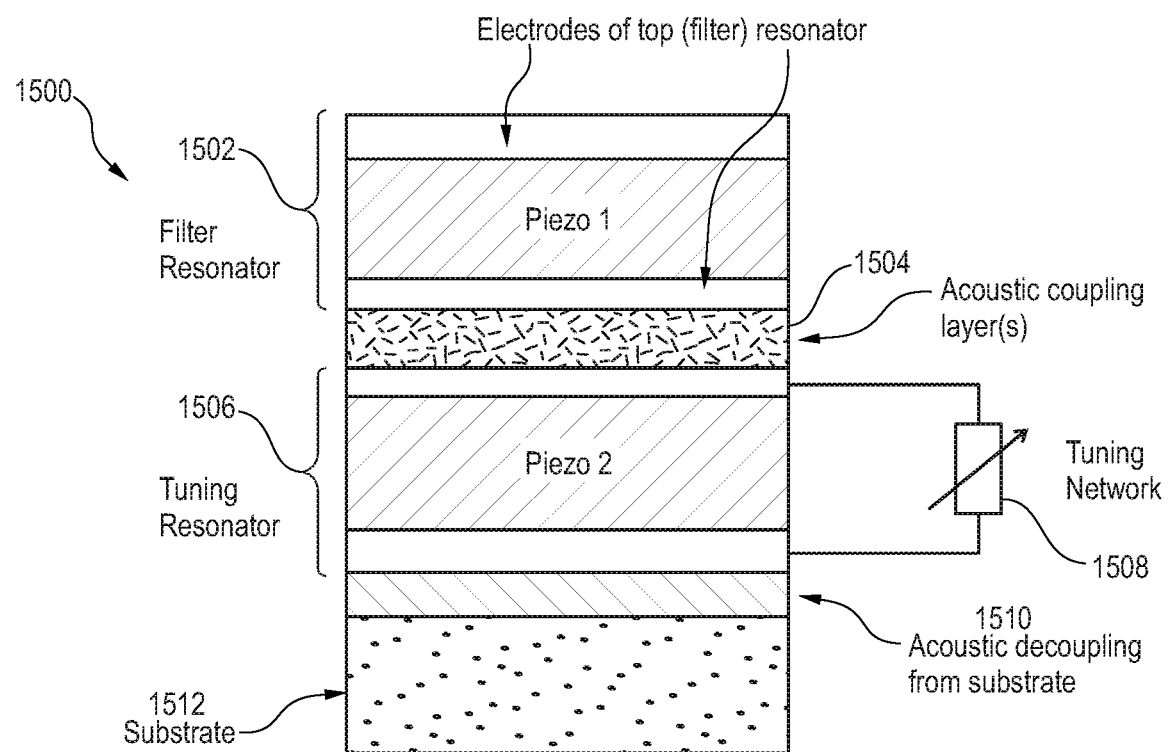
FIG. 15 is a cross-sectional diagram of a resonator element including a filter resonator in a top position in a layer stack and a tuning resonator in a bottom position in the layer stack, and a tuning circuit coupled to the tuning resonator.

FIG. 15 illustrates an example of a tunable BAW resonator 1500 with filter resonator 1502, tuning resonator 1506, and acoustic coupling layer(s) 1504 located between filter resonator 1502 and tuning resonator 1506. A variable tuning circuit 1508 is coupled to the tuning resonator 1506 of the example tunable BAW resonator of FIG. 15. Filter resonator 1502 includes piezoelectric layer Piezo 1 and tuning resonator 1506 includes piezoelectric layer Piezo 2. Also depicted in FIG. 15 is a substrate layer 1512, and an acoustic decoupling layer 1510 for acoustically decoupling the tunable BAW resonator 1500 from the substrate 1512.

FIG. 16 shows an example of a 2½ stage ladder filter 1600 with three series resonators 1602, 1606, and 1610, and two shunt resonators 1604 and 1608. Each resonator includes three elements: a filter resonator, a tuning resonator acoustically coupled to the filter resonator, and a tuning circuit electrically coupled to the tuning resonator that is described in further detail below. Thus, filter 1600 includes three series filter resonators 1602A, 1606A, 1610A, two shunt filter resonators 1604A, 1608A, RF input 1612 and RF output 1614. Each filter resonator is coupled to its own tuning network. Series filter resonator 1602A has a corresponding tuning network including tuning resonator 1602B coupled to tuning circuit 1602C. Shunt filter resonator 1604A has a corresponding tuning network including tuning resonator 1604B coupled to tuning circuit 1604C. Series filter resonator 1606A has a corresponding tuning network including tuning resonator 1606B coupled to tuning circuit 1606C. Shunt filter resonator 1608A has a corresponding tuning network including tuning resonator 1608B coupled to tuning circuit 1608C. Series filter resonator 1610A has a corresponding tuning network including tuning resonator 1610B coupled to tuning circuit 1610C. The impedance of each tuning network is scaled with the impedance (or area) of the respective resonator, in order to ensure that all individual resonators show the same (or similar) frequency tuning behavior. Impedance scaling ensures that there will be a uniform frequency shifting of the resulting bandpass filter curve shown in, for example, FIG. 8(a) to FIG. 13.

It is important to note that the symbols used for the tunable resonators are chosen to simplify the filter circuit drawing of FIG. 16. The "side-by-side" tunable resonator symbol is used to denote the acoustic coupling between a filter resonator and a tuning resonator. For a tunable BAW resonator, such as tunable resonator 1602, for example, both the filter and tuning resonators are combined and acoustically coupled in one layer stack on top of each other in an embodiment as shown in FIG. 15.

Frequency tunable RF filters are realized using circuit topologies with frequency tunable bulk acoustic wave (BAW) resonators with minimum parasitics, according to embodiments. In order to achieve best resonator performance, i.e. highest quality factors for the tunable resonances, it is important to minimize parasitics of the tuning network and the interconnects between the tuning network and the tuning resonator (electrodes). While it is possible to interconnect the individual filter resonators by utilizing the metallization layers of their electrodes, all tuning resonator require their own respective tuning networks. Tuning networks can be realized as programmable ICs in CMOS technologies, for example. Interconnecting the respective ports (terminals) of the tuning networks with the corresponding ports (electrodes) of the tuning resonators should ideally be realized with minimum parasitics, i.e. with minimum resistive losses. Therefore, the ports (electrodes) of the tuning resonators should be close to the surface of the BAW chip. As a consequence, the filter resonators should be located (fabricated) close to the substrate (with acoustic mirror or membrane/cavity for acoustic decoupling) and directly connected within their (buried) electrode metallization layers. The tuning resonators are then located (fabricated) on top of their respective filter resonators at/near the surface of the substrate. As a consequence, the interconnects between the tuning resonators and their tuning networks are as short and low-ohmic as possible, because deep vias are not required as in the case of tunable BAW resonators with filter resonators on top of their respective tuning resonators. Embodiments discussed below especially suit to filter implementations where every tunable BAW resonator requires its own tuning network. Thus, a ladder filter with N resonators, for example, needs 2*N interconnects to the tuning circuits, but only one interconnect (via) for the filter input, and one interconnect (via) for the filter output (plus ground connection).

Embodiments discussed in further detail below realize tunable (or programmable) RF filters based on tunable (or programmable) BAW (Bulk Acoustic Wave) resonators using at least some of the following construction aspects: each tunable BAW resonator is characterized by a layer stack in which the tuning resonator is positioned on top of the filter resonator; the individual tunable BAW filter resonators are coupled to each other within their respective electrode layers (some vias between these two electrode layers might be required in order to realize a specific filter topology, but such vias have a length determined by the piezoelectric layer thickness of the filter resonator and are thus quite short/shallow, typically around 1 μm); only the filter input and the filter output terminals are coupled by deep vias to the surface of the BAW filter chip, which minimizes the numbers of deep vias needed to combine the filter resonators to the filter circuit; and the tuning resonators of the individual tunable BAW resonators are all realized on top of their respective filter resonators. As a consequence, the interconnects of the tuning resonators to their respective tuning networks are as short as possible (at or near the chip surface) with only shallow vias for contacting the tuning resonator bottom electrodes. Such a configuration is extremely helpful for the tunable resonator performance and thus the overall filter performance.

Figure 17:
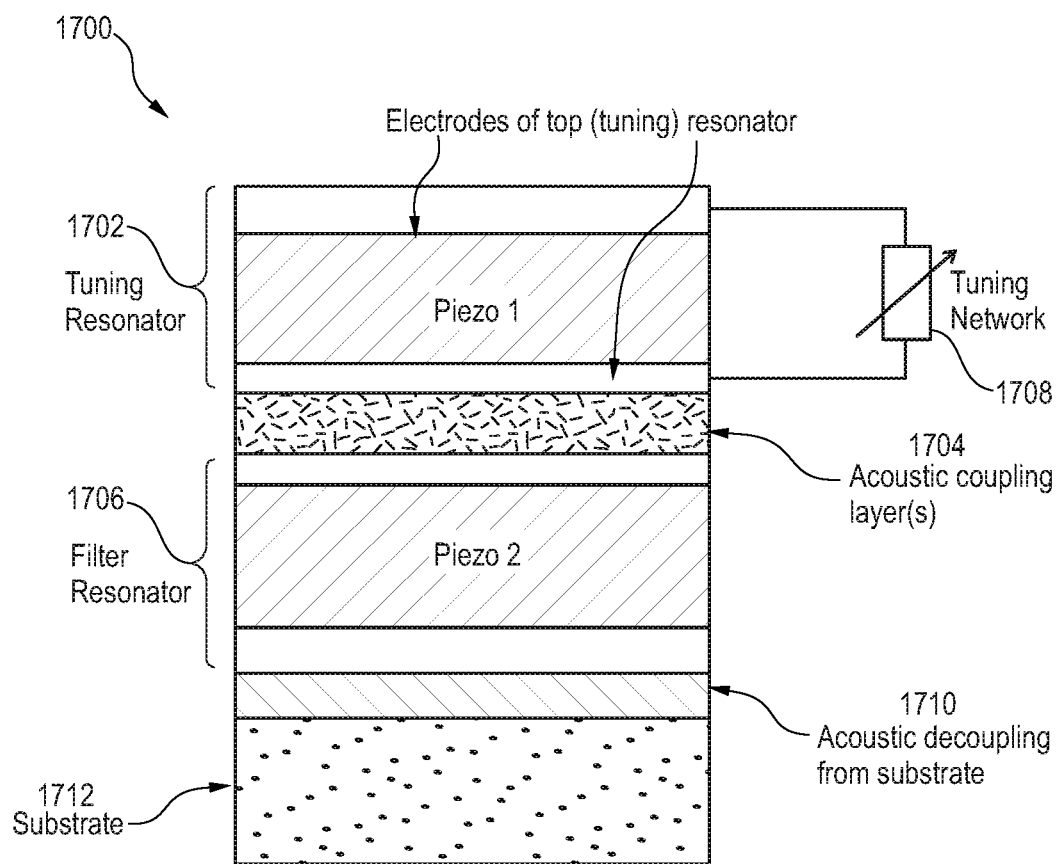
FIG. 17 is a cross-sectional diagram of a resonator element including a filter resonator in a bottom position in a layer stack and a tuning resonator in a top position in the layer stack, and a tuning circuit coupled to the tuning resonator.
Figure 18A:
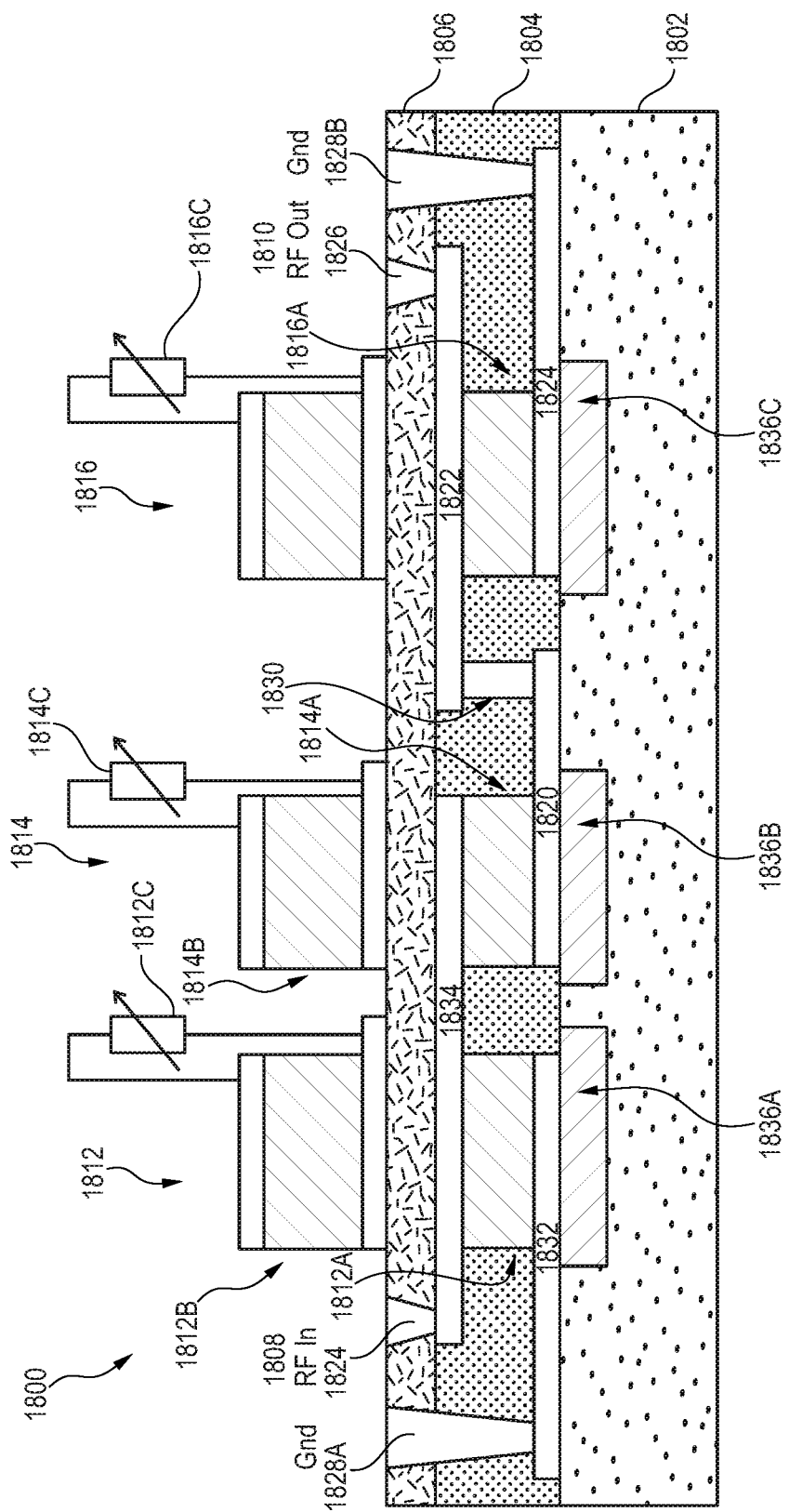
FIG. 18A is a cross-sectional diagram of a 1½ stage ladder filter integrated circuit, wherein each resonator element includes a filter resonator and a corresponding tuning resonator coupled to a tuning circuit, and deep vias that are used to provide ground access.

FIG. 17 shows an example of tunable BAW resonator 1700 with the tuning resonator 1702 on top of the filter resonator 1706 according to an embodiment. Also shown in FIG. 17 are the acoustic coupling layer 1704 and the tuning circuit 1708. The stacked layer construction shown in FIG. 17 is superior to the standard stacked layer construction 1500 of FIG. 15 in some respects as interconnects between the tuning networks and the tuning resonators are much easier to realize, and offer the additional advantage of smaller parasitics (especially ohmic losses). The filter resonators can be easily coupled with each other according to the filter topology to be realized by utilizing their electrode metallization layers (optionally in combination with some shallow vias between such electrode layers in some embodiments), thereby minimizing the overall number of vias, as will be explained in further detail below with respect to FIG. 18A. In the embodiment of FIG. 18A, each tuning resonator is coupled to its own tuning network.

FIG. 18A illustrates a schematic cross-sectional view through an integrated circuit filter 1800 having tunable resonators 1812, 1814, and 1816. As previously discussed, each tunable resonator includes a filter resonator, a tuning resonator, and a tuning circuit coupled in the manner previously discussed. Tunable resonator 1812 therefor includes a filter resonator 1812A, a tuning resonator 1812B, and a tuning circuit 1812C. Tunable resonator 1814 includes a filter resonator 1814A, a tuning resonator 1814B, and a tuning circuit 1814C. Tunable resonator 1816 includes a filter resonator 1816A, a tuning resonator 1816B, and a tuning circuit 1816C.

The particular filter configuration depicted in FIG. 18A is a one and a half stage ladder filter. Filter resonator 1812A is a shunt resonator coupled between ground (through bottom electrode 1832 and deep via 1828A) and RF IN (through top electrode 1834 and shallow via 1824). The top electrode 1834 of filter resonator 1812A is coupled to the top electrode 1834 of filter resonator 1814A as shown. Filter resonator 1814A is a series resonator coupled between filter resonator 1812A (in shunt configuration with top electrode 1834 coupled to RF In port 1808) and filter resonator 1816A (in shunt configuration with bottom electrode 1824 coupled to ground through deep via 1828B and top electrode 1822 coupled to the RF Out port 1810 through shallow via 1826). The top electrode 1822 of the shunt filter resonator 1816A is coupled to the bottom electrode 1820 of the series resonator 1814A. This connection uses a via 1830 between the respective electrode contacts 1820 and 1822. Note that—except for such via(s) 1830—the electrical coupling between electrodes of individual filter resonators can be realized by appropriate structuring of the respective metallization layers used for such electrodes. Realization of a filter circuit by coupling of series and shunt filter resonators can thus be achieved using a number of shallow vias and only two deep vias as shown.

Also shown in FIG. 18A are acoustic decoupling layers 1836A, 1836B and 1836C. Decoupling layer 1836A is used for decoupling resonator 1812 from substrate 1802. Decoupling layer 1836B is used for decoupling resonator 1814 from substrate 1802. Decoupling layer 1836C is used for decoupling resonator 1816 from substrate 1802.

The tuning resonators 1812B, 1814B, and 1816B are placed on top of the corresponding resonator stacks 1812A, 1814A, and 1816A, which results in short and low-ohmic interconnects to the tuning networks 1812C, 1814C, and 1816C. The filter resonators 1812A, 1814A, 1816 are located in the deeper regions of the resonator's layer stacks, closer to the substrate 1802 and the acoustic decoupling provided by a cavity or an acoustic mirror (shown in FIG. 18A as acoustic decoupling layers 1836A, 1836B, and 1836C previously described, in an embodiment). The filter resonators are interconnected with each other according to the filter circuit topology. Filter resonators 1812A and 1814A are coupled together with interconnect 1834, and filter resonators 1814A and 1816A are coupled together with interconnects 1820, 1822, and shallow via 1830. Such interconnects can be performed within the electrode metallization layers of the filter resonator without any via or with only a small number of (shallow) vias between the two electrode metallizations (depending on the filter topology). Deeper vias 1828A and 1828B are only needed for contacting RF In and RF Out in some embodiments, and for the ground connection for the embodiment shown in FIG. 18A.

In FIG. 18A, filter resonators 1812A, 1814A, 1816A are shown as being formed (or embedded) in an insulating layer 1804. The insulating layer can comprise, for example silicon dioxide or other known insulating materials. Acoustic coupling layer is shown as a common acoustic coupling layer 1806 for acoustically coupling the filter resonators and the tuning resonators. There can also be more than one layer and more than one material be used for acoustic decoupling. Tuning circuits 1812C, 1814C, and 1816C can at least partially be implemented using the same fabrication process as for the integrated circuit filter 1800. Alternatively, different fabrication processes can be used to realize the tuning circuits as is discussed in further detail below.

Figure 18B:
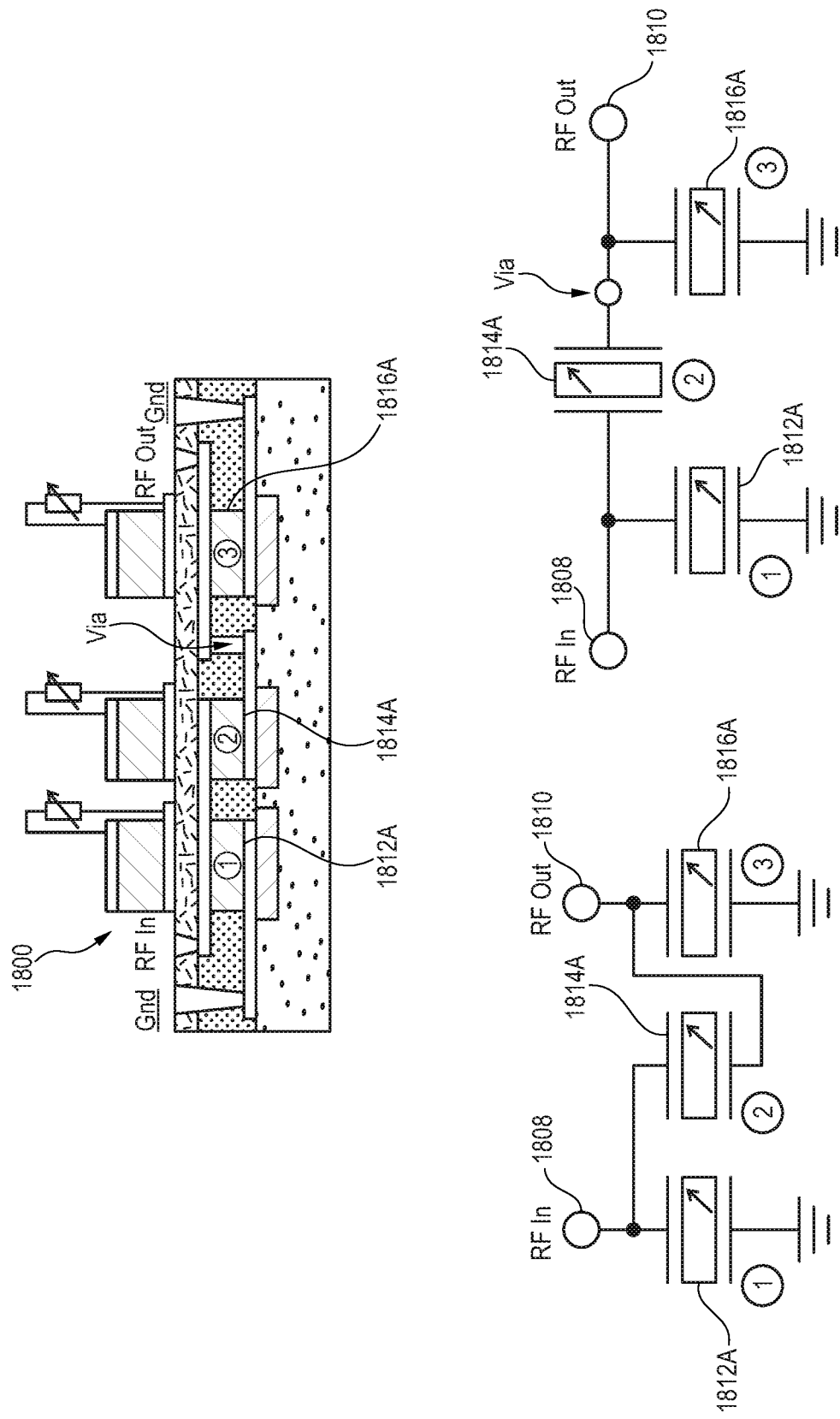
FIG. 18B is a schematic diagram corresponding to the ladder filter of FIG. 18A.

FIG. 18B reproduces the filter circuit of FIG. 18A, with the filter resonators 1812A, 1814A, and 1816A being highlighted with corresponding circle symbols (1), (2), and (3). The corresponding electrical schematics are also shown, with the left-hand schematic preserving the physical orientation of filter resonators 1812A, 1814A, and 1816A, and the right-hand schematic shown in a more conventional manner. The shunt resonators 1812A and 1816A and the series resonator 1814A are clearly shown coupled between RF IN port 1808 and RF OUT port 1810 in a ladder filter configuration.

Figure 19:
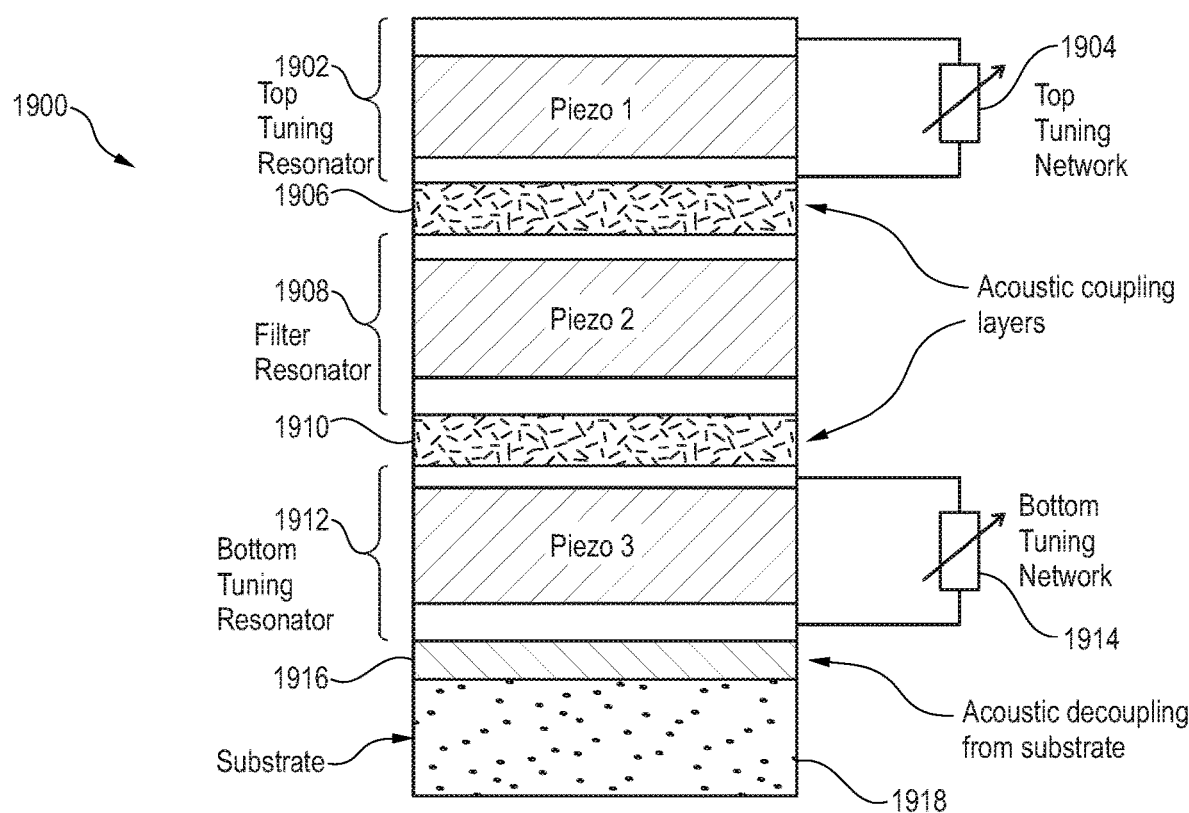
FIG. 19 is a cross-sectional diagram of a resonator element in a layer stack including a first tuning resonator in a top position coupled to a first tuning circuit, a filter resonator in a middle position, and a second tuning resonator in a bottom position coupled to a second tuning circuit.

An example of a frequency tunable bulk acoustic wave (BAW) resonator with enhanced tuning range is illustrated in FIG. 19 and described below. As discussed earlier herein, tunable BAW resonators can be realized as a pair of coupled BAW resonators. One resonator is the filter resonator, i.e. the resonator to build into filter circuit topologies. The other acoustically coupled BAW resonator is the tuning resonator. The tuning resonator is coupled to a tuning network. The tuning resonator combined with the tuning network effectively act as tuning layer within the filter resonator layer stack. This tuning layer offers a tunable mechanical stiffness. The tunable mechanical stiffness depends on the tuning network settings and affects the acoustic velocities and the acoustic impedance of the tuning layer.

Referring again to FIG. 19, a composite BAW resonator 1900 includes two (instead of only one, see for example FIGS. 15 and 17) tuning resonators 1902 and 1912 inside the layer stack of the tunable resonator 1900. The two tuning resonators 1902 and 1912 are placed on both sides on the filter resonator, i.e. one tuning resonator (top tuning resonator 1902) above the filter resonator 1908 and the second tuning resonator (bottom tuning resonator 1912) below the filter resonator. Thus, effectively, tuning layers with tunable mechanical stiffness are placed on both sides (top and bottom) of the filter resonator.

Also shown in FIG. 19 is that top tuning resonator includes a piezoelectric layer Piezo 1 and is coupled to a tuning circuit 1904. Filter resonator 1908 includes a piezoelectric layer Piezo 2. Bottom tuning resonator includes a piezoelectric layer Piezo 3 and is coupled to a tuning circuit 1914. Acoustic coupling layer 1906 acoustically couples top tuning resonator 1902 and filter resonator 1908. Acoustic coupling layer 1910 acoustically couples bottom tuning resonator 1912 to filter resonator 1908. In particular, acoustic coupling layer 1906 is coupled between a bottom electrode of top tuning resonator 1902 and a top electrode of filter resonator 1908. Similarly, acoustic coupling layer 1910 is coupled between a bottom electrode of filter resonator 1908 and a top electrode of bottom tuning resonator 1912. The areas of resonators 1902, 1908, and 1912 are matched. The static capacitances of the filter resonator 1908 and the two tuning resonators 1902 and 1912 depend on the area, but also on the thicknesses and the dielectric constants of the individual piezoelectric layers resp. materials, and typically differ from each other. As in previous embodiments, the filter signal terminals are associated with the top and bottom electrodes of the filter resonator. Resonator 1900 can be used as desired in a ladder filter as previously described.

Also shown in FIG. 19 is the substrate layer 1918, and the acoustic decoupling layer 1916 for acoustically decoupling resonator 1900 from the substrate 1918.

The composite resonator 1900 of FIG. 19 is a layer stack in an embodiment that provides an enhanced tuning range compared with the single tuning resonator embodiments shown in FIGS. 15 and 17.

Referring now to FIGS. 20-26, embodiments of a tuning circuit with enhanced tuning range including an inductor are described. The addition of an inductor to the tuning circuit provides a tuning range improvement over a tuning circuit including only a variable capacitor. An inductor with a high Q (quality factor) can be integrated on a piezoelectric die with the corresponding resonator, an interposer material, an RF filter control chip or an IPD (integrated passive device), according to whichever available manufacturing process provides the best metal layers for the inductor. Metal layers with low resistivity can be used in order to design high Q inductors. For example, thick copper or aluminum metal layers can be patterned into high Q inductors suitable for use in the tuning circuit.

The higher the Q of the inductor used, the higher the resonator can be extended in its tuning range to higher frequencies without significant losses. An inductor Q of 30 to 50 may enable an increase of the total tuning range by a factor of 1.5, for example.

The tuning network is complemented with a high Q inductor which is integrated on the Piezoelectric die (FIG. 23) or the interposer material (FIG. 24) or the RF Filter control chip (FIG. 25 or 26) or an IPD (FIG. 25 or 26) as will be explained in further detail below.

Figure 20A:
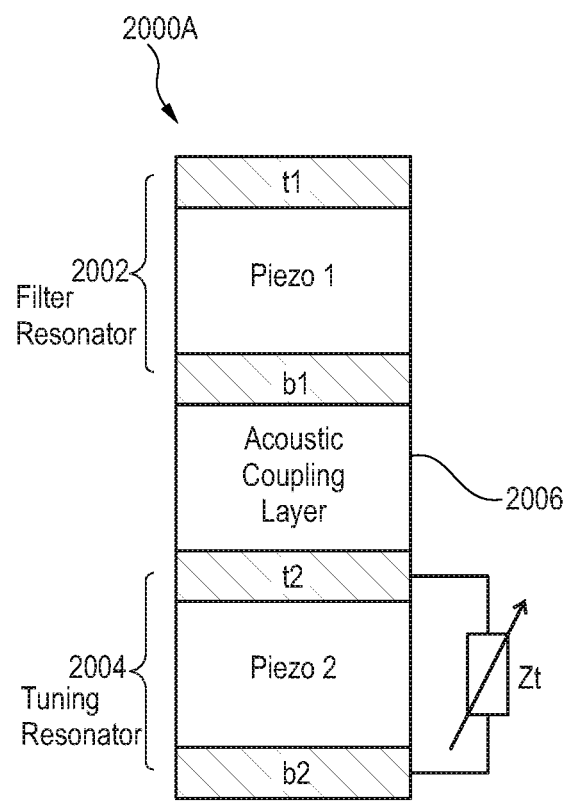
FIG. 20A and FIG. 20B show cross sectional diagrams of resonator element layer stacks including tuning resonators in top and bottom positions, coupled to a corresponding tuning network Zt.

FIG. 20A illustrates a tunable BAW resonator 2000A with a filter resonator 2002, a tuning resonator 2004, and acoustic coupling layer(s) 2006 therebetween. Filter resonator 2002 includes a top electrode t1, a piezoelectric layer Piezo 1, a bottom electrode b1, and is located above acoustic coupling layer 2006 in a layer stack. Tuning resonator 2004 includes a top electrode t2, a piezoelectric layer Piezo 2, a bottom electrode b2, and is located below acoustic coupling layer 2006 in the layer stack. A tuning network (with tunable/programmable impedance) Zt is coupled to tuning resonator 2004. In an embodiment, tuning network Zt includes both an inductor and a variable capacitor.

Figure 20B:
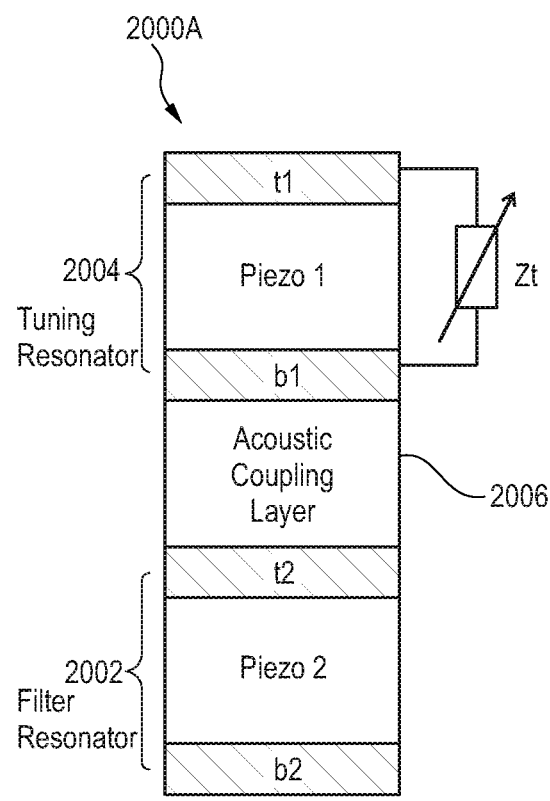

FIG. 20B illustrates a tunable BAW resonator 2000B with a filter resonator 2002, a tuning resonator 2004, and acoustic coupling layer(s) 2006 therebetween. Filter resonator 2002 includes a top electrode t2, a piezoelectric layer Piezo 2, a bottom electrode b2, and is located below acoustic coupling layer 2006 in the layer stack. Tuning resonator 2004 includes a top electrode t1, a piezoelectric layer Piezo 1, a bottom electrode b1, and is located above acoustic coupling layer 2006 in the layer stack. A tuning network Zt is coupled to tuning resonator 2004. In an embodiment, tuning network Zt includes both an inductor and a variable capacitor.

Figure 21A:
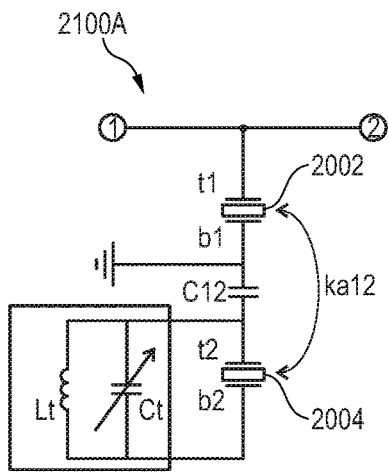
FIGS. 21A through 21D are circuit diagrams of shunt and series resonator elements including tuning resonators in either a top position or in a bottom position, coupled to a corresponding tuning network Zt including a variable capacitor and an inductor.
Figure 21C:
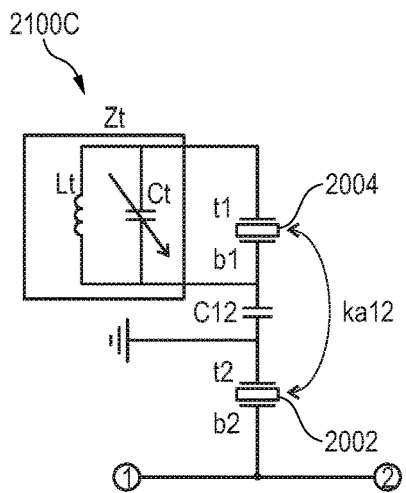
Figure 21B:
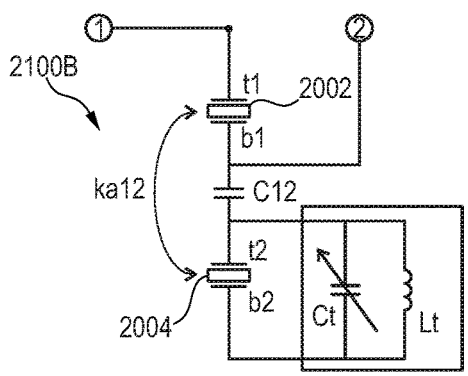
Figure 21D:
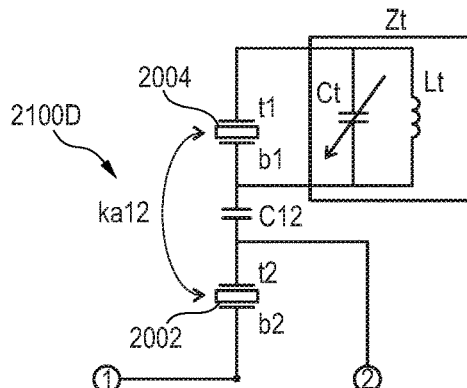

FIGS. 21A through 21D illustrate that acoustically coupled resonator devices can be in a shunt or a series configuration. FIGS. 21A and 21B show the shunt configuration (with one electrode of the filter resonator grounded), whereas FIGS. 21C and 21D show the series configuration. The electric ports have the reference numbers 1 and 2. Zt is an impedance, which is coupled in parallel to the two electrodes of the tuning resonator. In practice Zt could include a high-Q inductor Lt, and a variable capacitor Ct could be implemented by a programmable capacitor, like a C-tuner available from Infineon Technologies. In FIGS. 21A through 21D, the acoustic coupling layer is shown having a static capacitance of C12 and an acoustic coupling component ka12. Each tuning resonator is shown as being coupled to corresponding tuning circuit Zt.

FIG. 21A shows a shunt resonator 2100A with the filter resonator 2002 in the top position and the tuning resonator 2004 in the bottom position in a layer stack. FIG. 21B shows a series resonator 2100B with the filter resonator 2002 in the top position and the tuning resonator 2004 in the bottom position in the layer stack. FIG. 21C shows a shunt resonator 2100C with the filter resonator 2002 in the bottom position and the tuning resonator 2004 in the top position in the layer stack. FIG. 21D shows a series resonator 2100D with the filter resonator 2002 in the bottom position and the tuning resonator 2004 in the top position in the layer stack.

Figure 22:
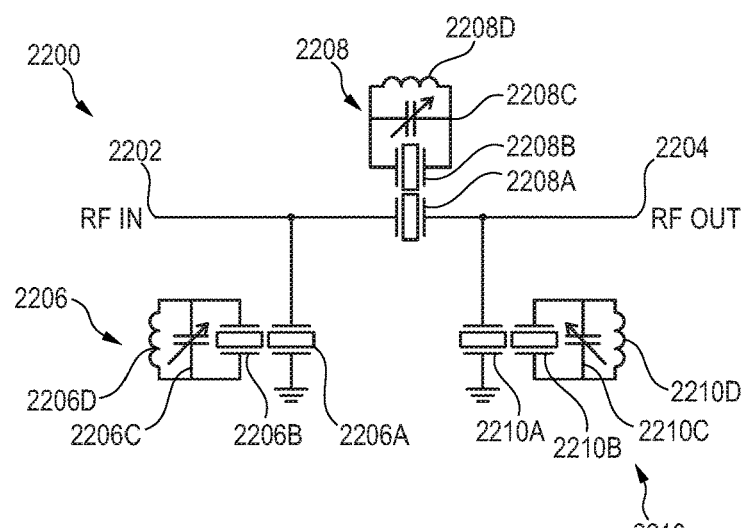
FIG. 22 is a schematic diagram of a 1½ stage ladder filter, wherein each filter resonator includes a corresponding tuning resonator coupled to a tuning circuit, the tuning circuit including a variable capacitor and an inductor.

FIG. 22 illustrates an example of a 1½ stage ladder filter 2200 with one series tunable resonator 2208 (filter resonator 2208A, tuning resonator 2208B, variable capacitor 2208C, and inductor 2208D) and two shunt tunable resonators 2206 (filter resonator 2206A, tuning resonator 2206B, variable capacitor 2206C, and inductor 2206D) and 2210 (filter resonator 2210A, tuning resonator 2210B, variable capacitor 2210C, and inductor 2210D). Each tunable resonator includes a filter resonator and a tuning resonator that is coupled to a tuning circuit that comprises a variable capacitor and an inductor. Also shown in FIG. 22 are an RF In port 2202 and an RF Out port 2204.

The impedance of each tuning network scales inversely with the static capacitance (or area) of the respective tuning resonator, in order to ensure that all individual resonators show the same (or similar) frequency tuning behavior. Matching tuning impedances ensures a uniform frequency shifting of the resulting bandpass filter curve. By coupling high Q inductors in parallel to the tuning capacitor, the tuning range of the equivalent filter can be increased significantly. It is important to note that the symbols used for the tunable resonators are chosen to simplify the filter circuit drawing. For the tunable BAW resonator, both of the filter and tuning resonators are combined and acoustically coupled in a layer stack on top of each other as has been described herein.

Figure 23:
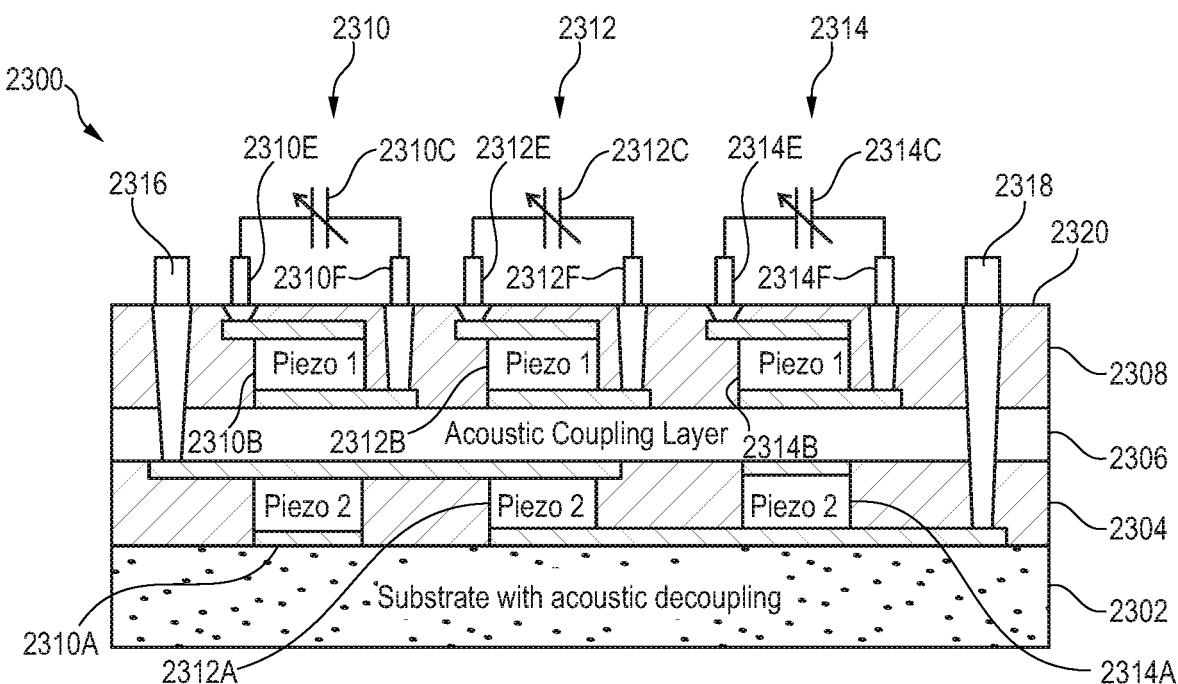
FIGS. 23 through 26 illustrate various integrated circuit implementations of the ladder filter of FIG. 22.
Figure 23:
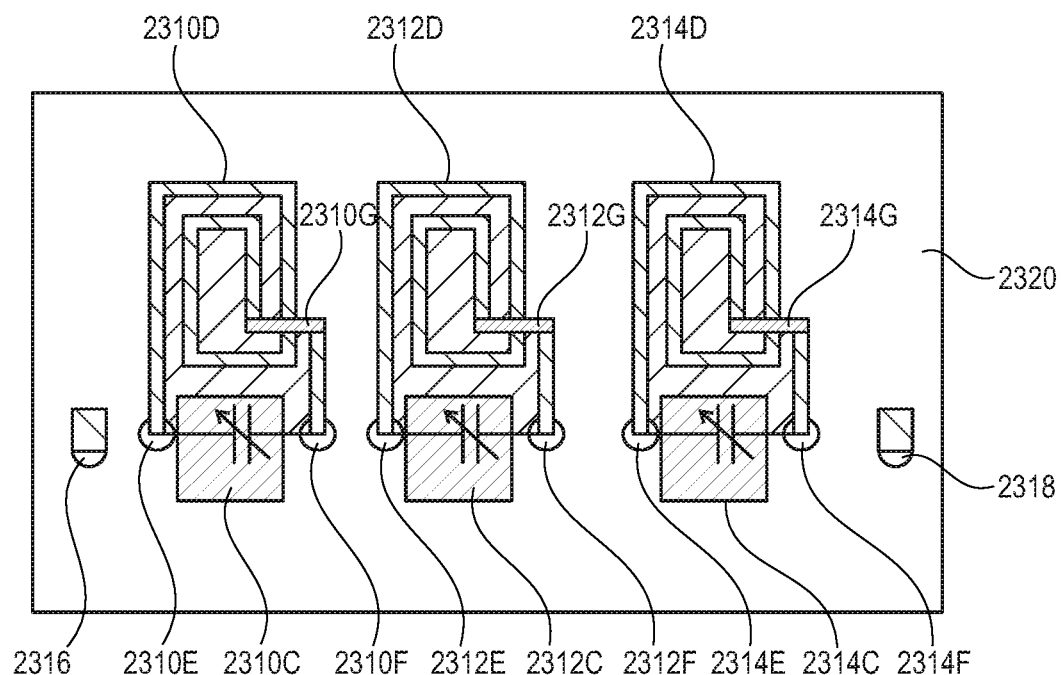

FIG. 23 illustrates in an integrated circuit example of a 1½ stage ladder filter 2300 with one tunable series resonator 2312 (filter resonator 2312A, tuning resonator 2312B, variable capacitor 2312C, and inductor 2312D) and two shunt tunable resonators 2310 (filter resonator 2310A, tuning resonator 2310B, variable capacitor 2310C, and inductor 2310D) and 2314 (filter resonator 2314A, tuning resonator 2314B, variable capacitor 2314C, and inductor 2314D). The inductive part of tuning impedance Zt, Lt, is integrated on the piezoacoustic die, preferable with a thick layer of metal with very low resistance in order to achieve very high Q inductors (Ql>15, wherein Ql is the loaded quality factor). The capacitive portion of tuning impedance Zt, Ct is illustrated as a varactor in FIG. 23.

The upper portion of FIG. 23 illustrates a cross-sectional view of a piezoacoustic die including a substrate 2302, an insulating layer 2304 including filter resonators 2310A, 2312A, 2314A, acoustic coupling layer 2306, and insulating layer 2308 including tuning resonators 2310B, 2312B, 2314B. Metalized via 2316 is configured for providing an RF input and contacts an upper electrode of filter resonators 2310A and 2312A. Metalized via 2318 is configured for providing an RF output and contacts a bottom electrode of filter resonators 2312A and 2314A. Metalized vias 2310E and 2310F are configured to electrically contact tuning resonator 2310B and variable capacitor 2310C and inductor 2310D. Metalized vias 2312E and 2312F are configured to electrically contact tuning resonator 2312B and variable capacitor 2312C and inductor 2312D. Metalized vias 2314E and 2314F are configured to electrically contact tuning resonator 2314B and variable capacitor 2314C and inductor 2314D.

The bottom portion of FIG. 23 shows an implementation of variable capacitors 2310C, 2312C, 2314C and inductors 2310D, 2312D, 2314D on an upper surface 2320 of integrated circuit filter 2300. In pertinent part, inductors 2310D, 2312D, and 2314D are shown as patterned metal traces using a metal layer that would be available in the piezoacoustic integrated circuit process used to fabricate the lower layers of the chip. Inductors 2310D, 2312D, 2314D include a corresponding crossover 2310G, 2312G, 2314G so that the innermost coil of the inductor can be electrically contacted. Typically, variable capacitors 2310C, 2312C, and 2314C are fabricated on a different chip and electrically coupled to 2310E/2310F, 2312E/F, and 2314E/F, respectively. Variable capacitors 2310C, 2312C, and 2314C can be fabricated as varactors using a capacitor-connected transistor, in an embodiment.

Figure 24:
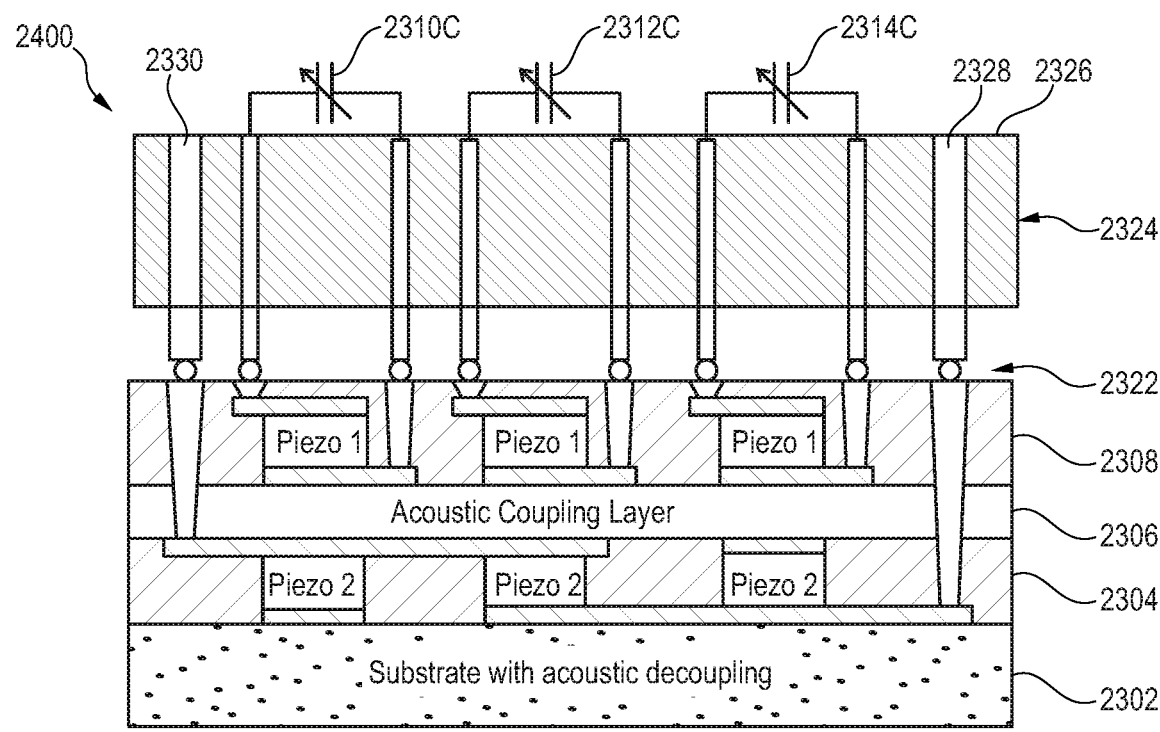
Figure 24:
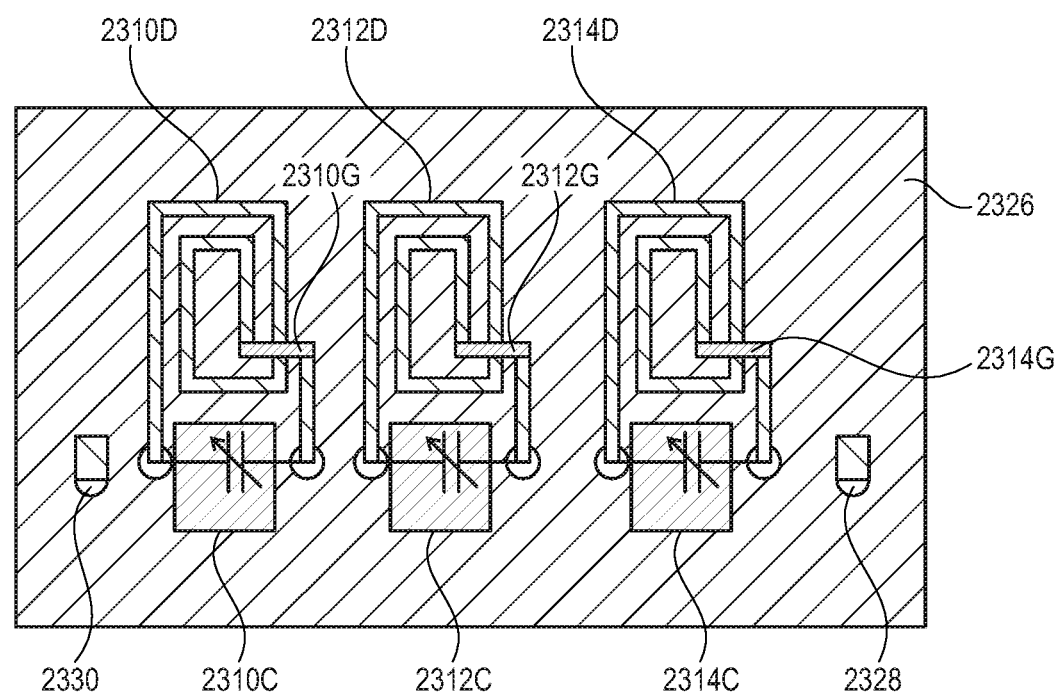

FIG. 24 illustrates an example of a 1½ stage ladder filter 2400 fabricated in a piezoacoustic chip including layers 2302, 2304, 2306, and 2308 as previously described with respect to FIG. 23, but where the inductive part of Zt, Lt is integrated on an interposer metal layer (on e.g. laminate) 2324. In FIG. 24, the inductor metal layer may not be available on the piezoacoustic chip, but is available on the interposer 2324. For the inductor metal, a thick layer of metal with very low resistance is preferred in order to achieve very high Q inductors (Ql>15). The capacitive portion of Zt, Ct is just illustrated as a varactor in the block diagram. A metalized through-via 2330 is used to provide an RF In port in an embodiment. A metalized through-via 2328 is used to provide an RF Out port in an embodiment. Interposer 2324 includes an additional plurality of metalized through-vias for contacting varactors 2310C, 2312C, 2314C and inductors 2310D, 2312D, 2314D shown in a plan view below. Interposer 2324 includes a top surface 2326 for fabricating the inductors and connecting the variable capacitors. Also shown in the top portion of FIG. 24 is a ball grid array 2322 for electrically contacting the corresponding through-vias in the interposer 2324.

A bottom portion of FIG. 24 shows the top surface 2326 of the interposer 2324 including the mounted/attached/coupled variable capacitors 2310C, 2312C, 2314C, and the corresponding coupled inductors 2310D, 2312D, and 2314D, fabricated as part of the interposer 2324 or 2326, respectively. The inductors include corresponding crossovers 2310G, 2312G, 2314G whose function was previously described with respect to FIG. 23.

Figure 25:
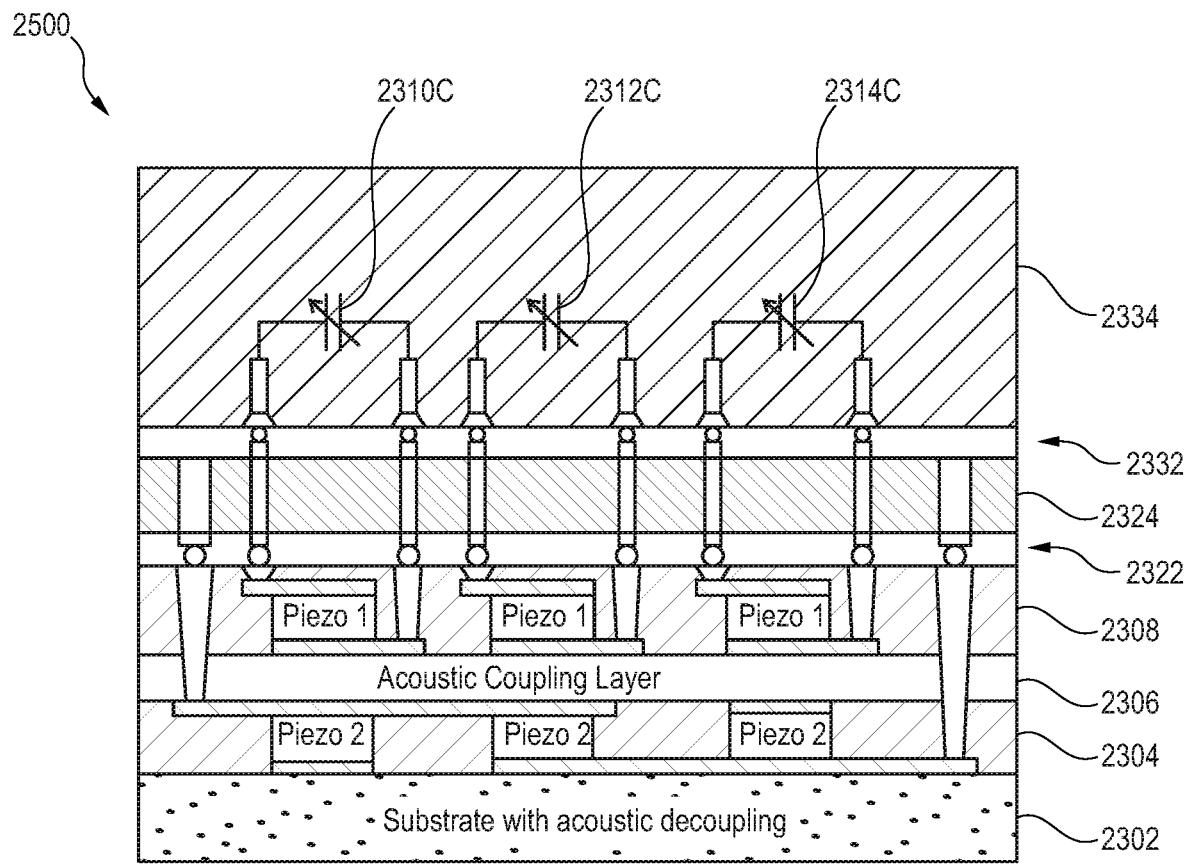
Figure 25:
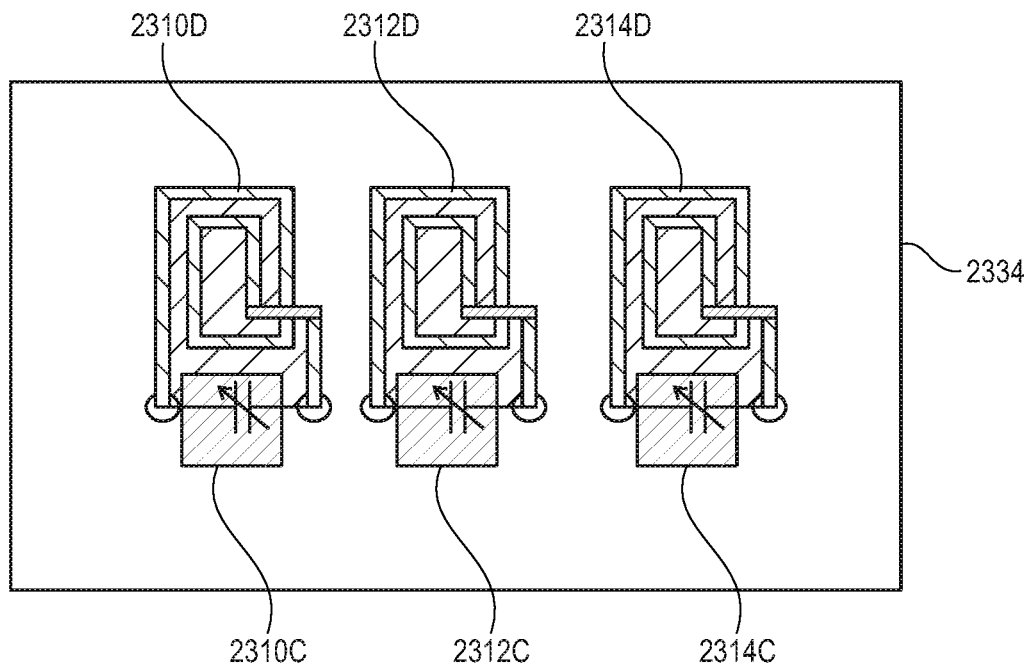

FIG. 25 illustrates an example of a 1½ stage ladder filter 2500 with one series tunable resonators and two shunt tunable resonators. The inductive part of Zt, Lt is integrated on thick metal layer(s) of a filter control chip with very low resistance or a high Q IPD with very low resistance through an interposer material (e.g. two layer laminate) in order to achieve very high Q inductors (Ql>15). The capacitive portion of Zt, Ct is illustrated as a varactor in FIG. 25.

An upper portion of FIG. 25 shows a cross-sectional view of the construction of the ladder filter 2500 according to an embodiment. Depicted are the piezoacoustic chip including interconnected layers 2302, 2304, 2306, and 2308 all previously discussed, as well as ball grid array 2322. An interposer 2324 includes a plurality of through-vias for coupling the piezoacoustic chip to the IPD 2334. IPD 2334 includes variable capacitors 2310C, 2312C, 2314C and inductors 2310D, 2312D, 2314D, as well as ball grid array 2332. The inductors and variable capacitors in IPD 2334 can be fabricated within or on top the IPD according to the IPD process used.

The lower portion of FIG. 25 shows a plan view of the IPD 2334 including variable capacitors 2310C, 2312C, and 2314C, and inductors 2310D, 2312D, and 2314D.

Figure 26:
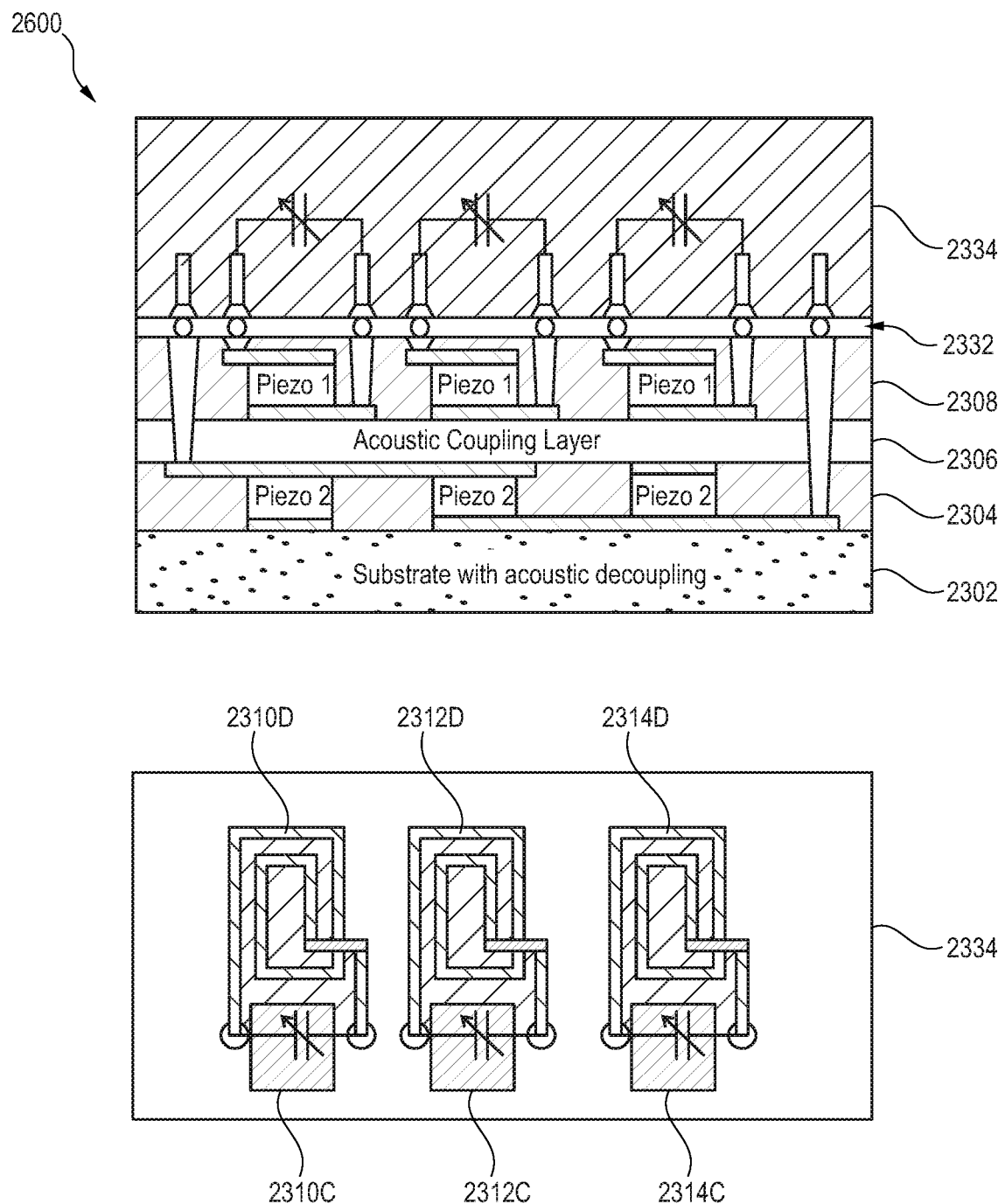

FIG. 26 illustrates an example of a 1½ stage ladder filter 2600 substantially as described with respect to FIG. 25. However, in FIG. 26 it should be noted that the IPD 2334 is coupled directly to ball grid array 2332 as shown, and interposer 2324 is removed. The upper portion of FIG. 26 is a cross-sectional view of the ladder filter 2600, and the bottom portion of FIG. 26 is a plan view of the IPD 2334 as previously described.

It should be noted that while in the above-discussed embodiments a tuning circuit is provided only to the second or third resonators of the respective resonator elements, in other embodiments of resonator elements and methods in addition a further tuning circuit may be provided to the first resonator element. The further tuning circuit may be implemented in a similar manner as has been explained above for the tuning circuit, e.g. as an impedance network.

While filters using resonator elements as described above may in particular be used in communication devices like mobile communication devices, and such communication devices using corresponding filter structures may form embodiments, the filters may also be used in other devices where signals, in particular high frequency signals in GHz-range, are to be filtered.

An example method is described below.

A method, comprising: providing a resonator stack including a first resonator and a second resonator; including a first resonator of the resonator stack in a filter structure; and providing a tuning circuit to the second resonator of the resonator stack.

The method described above, wherein providing the resonator stack comprises providing the first resonator and the second resonator separated by at least one dielectric layer.

The method described above, wherein providing the tuning circuit comprises providing an inductor in parallel to a variable capacitor.

The method described above, further comprising providing a further tuning circuit to the first resonator.

The above discussed embodiments serve only as examples and are not to be construed as limiting, as other implementation possibilities besides those explicitly shown and described exist.

What is claimed is:

1. A resonator element for a filter, comprising:
a first resonator having a first terminal and a second terminal for coupling to a filter structure;
a second resonator having a third terminal and a fourth terminal, wherein the second resonator is acoustically coupled to the first resonator; and
a tuning circuit coupled to the third and fourth terminals,
wherein the first resonator comprises a first piezoelectric material, and the second resonator comprises a second piezoelectric material, and wherein a piezoelectric electromechanical coupling constant $k_{T^2}$ of the first piezoelectric material is smaller than 10%.

2. The resonator element of claim 1, wherein the first resonator and the second resonator are implemented as a resonator stack.

3. The resonator element of claim 2, wherein one of the first resonator or the second resonator is formed on an acoustically decoupled region of a substrate, and the other one of the first resonator and the second resonator is formed on the one of the first resonator or second resonator.

4. The resonator element of claim 1, further comprising a further tuning circuit coupled to the first and second terminals.

5. The resonator element of claim 1, wherein a piezoelectric coupling of the first piezoelectric material is lower than a piezoelectric coupling of the second piezoelectric material.

6. The resonator element of claim 1, wherein the second terminal and third terminal are implemented as a common terminal or are electrically coupled to each other.

7. The resonator element of claim 1, wherein a piezoelectric electromechanical coupling constant $k_{T^2}$ of the second piezoelectric material is larger than 10%.

8. The resonator element of claim 1, wherein the first piezoelectric material comprises at least one of aluminum nitride or scandium-doped aluminum nitride.

9. The resonator element of claim 1, wherein the second piezoelectric material comprises at least one of lithium niobate, potassium niobate or scandium-doped aluminum nitride.

10. The resonator element of claim 1, wherein the tuning circuit comprises an impedance network.

11. The resonator element of claim 10, wherein the impedance network comprises at least one of a variable capacitance, a switch, a switch with a fixed capacitance or a switch in parallel to a fixed capacitance.

12. The resonator element of claim 10, wherein the impedance network comprises at least one inductor.

13. The resonator element of claim 12, wherein the at least one inductor has an inductivity below 50 nH.

14. The resonator element of claim 12, wherein the at least one inductor has a Q-factor of at least 10.

15. A filter device, comprising:
a signal input;
a signal output; and
a resonator element coupled between the signal input and the signal output, wherein the resonator element comprises
a first resonator having a first terminal and a second terminal,
a second resonator having a third terminal and a fourth terminal, wherein the second resonator is acoustically coupled to the first resonator, and
a tuning circuit coupled to the third and fourth terminals,
wherein the first resonator comprises a first piezoelectric material, and the second resonator comprises a second piezoelectric material, and wherein a piezoelectric electromechanical coupling constant $k_{T^2}$ of the first piezoelectric material is smaller than 10%.

16. The filter device of claim 15, wherein the first terminal of the first resonator is coupled to the signal input, and the second terminal of the first resonator is coupled to the signal output.

17. The filter device of claim 15, wherein the first terminal of the first resonator is coupled to the signal input and the signal output, and the second terminal is coupled to ground.

18. A method of providing a resonator element for a filter, the method comprising:
providing a first resonator having a first terminal and a second terminal for coupling to a filter structure;
providing a second resonator having a third terminal and a fourth terminal, wherein the second resonator is acoustically coupled to the first resonator; and
providing a tuning circuit coupled to the third and fourth terminals,
wherein the first resonator comprises a first piezoelectric material, and the second resonator comprises a second piezoelectric material, and wherein a piezoelectric electromechanical coupling constant $k_{T^2}$ of the first piezoelectric material is set to be smaller than 10%.

19. The method of providing a resonator element of claim 18, wherein the first resonator and the second resonator are implemented as a resonator stack.

20. The method of providing a resonator element of claim 19, wherein one of the first resonator or the second resonator is formed on an acoustically decoupled region of a substrate, and the other one of the first resonator and the second resonator is formed on the one of the first resonator or second resonator.

21. The method of providing a resonator element of claim 18, wherein a piezoelectric coupling of the first piezoelectric material is lower than a piezoelectric coupling of the second piezoelectric material.

22. The method of providing a resonator element of claim 18, wherein a piezoelectric electromechanical coupling constant $k_{T^2}$ of the second piezoelectric material is set to be larger than 10%.

23. The method of providing a resonator element of claim 18, wherein the first piezoelectric material comprises at least one of aluminum nitride or scandium-doped aluminum nitride.

24. The method of providing a resonator element of claim 18, wherein the second piezoelectric material comprises at least one of lithium niobate, potassium niobate or scandium-doped aluminum nitride.

25. The method of providing a resonator element of claim 18, wherein the tuning circuit comprises an impedance network.

26. The method of providing a resonator element of claim 25, wherein the impedance network comprises at least one of a variable capacitance, a switch, a switch with a fixed capacitance or a switch in parallel to a fixed capacitance.

27. The method of providing a resonator element of claim 25, wherein the impedance network comprises at least one inductor.

28. The method of providing a resonator element of claim 27, wherein the at least one inductor has an inductivity below 50 nH.

* * * * *